(12) United States Patent
Baek et al.

(10) Patent No.: US 12,400,565 B2
(45) Date of Patent: Aug. 26, 2025

(54) DISPLAY PANEL INCLUDING TEST PIXEL

(71) Applicant: Samsung Display Co., Ltd., Yongin-si (KR)

(72) Inventors: Kwanghyun Baek, Yongin-si (KR); Jungkook Park, Yongin-si (KR); Donghak Pyo, Yongin-si (KR); Moonsang Hwang, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 18/427,738

(22) Filed: Jan. 30, 2024

(65) Prior Publication Data

US 2024/0321156 A1    Sep. 26, 2024

(30) Foreign Application Priority Data

Mar. 24, 2023  (KR) .......................... 10-2023-0039082
Jul. 18, 2023   (KR) .......................... 10-2023-0093306

(51) Int. Cl.
*G09G 3/3233* (2016.01)
*G09G 3/00* (2006.01)
*H10K 59/131* (2023.01)

(52) U.S. Cl.
CPC ........... *G09G 3/006* (2013.01); *G09G 3/3233* (2013.01); *H10K 59/131* (2023.02); *G09G 2300/0426* (2013.01); *G09G 2300/0452* (2013.01); *G09G 2300/0819* (2013.01); *G09G 2300/0852* (2013.01); *G09G 2300/0861* (2013.01); *G09G 2310/08* (2013.01); *G09G 2330/12* (2013.01)

(58) Field of Classification Search
CPC ................. G09G 3/006; G09G 3/3233; G09G 2300/0426; G09G 2300/0452; G09G 2300/0819; G09G 2300/0852; G09G 2300/0861; G09G 2310/08; G09G 2330/12; H10K 59/121
See application file for complete search history.

(56) References Cited

U.S. PATENT DOCUMENTS

| | | | |
|---|---|---|---|
| 11,004,401 B2 | 5/2021 | Chu et al. | |
| 11,127,351 B2 | 9/2021 | Miwa et al. | |
| 2015/0379923 A1* | 12/2015 | Lee | G09G 3/3233 |
| | | | 345/82 |
| 2016/0300526 A1* | 10/2016 | Lim | G09G 3/3233 |
| 2016/0372029 A1* | 12/2016 | Park | G09G 3/3233 |

(Continued)

FOREIGN PATENT DOCUMENTS

| | | |
|---|---|---|
| JP | 2013-186446 A | 9/2013 |
| JP | 6872795 B2 | 5/2021 |

(Continued)

*Primary Examiner* — Adam J Snyder
(74) *Attorney, Agent, or Firm* — Womble Bond Dickinson (US) LLP

(57) ABSTRACT

A display panel includes a substrate including a display area, and a peripheral area surrounding the display area in plan view, a pixel circuit in the display area, a light-emitting diode in the display area, electrically connected to the pixel circuit, and including a pixel electrode, an opposite electrode, and an emission layer between the pixel electrode and the opposite electrode, a test circuit in the peripheral area, and a pseudo-diode in the peripheral area, electrically connected to the test circuit, and including a first transistor.

20 Claims, 14 Drawing Sheets

(56) References Cited

U.S. PATENT DOCUMENTS

| | | | |
|---|---|---|---|
| 2019/0108789 A1* | 4/2019 | Tsuge | G09G 3/3233 |
| 2019/0147781 A1* | 5/2019 | Park | G09G 3/3233 |
| | | | 345/691 |
| 2021/0202759 A1* | 7/2021 | Lee | H10D 30/6757 |

FOREIGN PATENT DOCUMENTS

| | | |
|---|---|---|
| KR | 10-2020-0024977 A | 3/2020 |
| KR | 10-2459026 B1 | 10/2022 |

* cited by examiner

DISPLAY PANEL INCLUDING TEST PIXEL

CROSS-REFERENCE TO RELATED APPLICATIONS

The present application claims priority to, and the benefit of, Korean Patent Application Nos. 10-2023-0039082, filed on Mar. 24, 2023, and 10-2023-0093306, filed on Jul. 18, 2023, in the Korean Intellectual Property Office, the entire disclosure of which are incorporated herein by reference.

BACKGROUND

1. Field

One or more embodiments relate to a display panel in which the degree of degradation of a transistor constituting a pixel circuit may be easily checked.

2. Description of the Related Art

Recently, display devices have been manufactured to be thinner and lighter, and thus, their range of use has widened. A display device may include a plurality of pixels, including transistors and capacitors that are for controlling the luminance of each pixel, and wires connected to the plurality of pixels.

The transistors may undergo degradation due to factors, such as light, electrical stress, and external impurities, and thus, the electrical characteristics thereof may be changed. To reduce or prevent the likelihood of a deterioration in the quality of an image implemented by the display device, degradation curves of transistors may be measured to compensate for degradation of transistors.

SUMMARY

When degradation curves of transistors are measured by selecting a representative display panel and are uniformly applied to all display panels to compensate for degradation, variations for each display panel may not be compensated for. To solve various problems including the above problem, one or more embodiments include a display panel in which degradation curves of transistors may be easily measured. However, such a technical problem is an example, and one or more embodiments are not limited thereto.

Additional aspects will be set forth in part in the description which follows and, in part, will be apparent from the description, or may be learned by practice of the presented embodiments of the disclosure.

According to one or more embodiments, a display panel includes a substrate including a display area, and a peripheral area surrounding the display area in plan view, a pixel circuit in the display area, a light-emitting diode in the display area, electrically connected to the pixel circuit, and including a pixel electrode, an opposite electrode, and an emission layer between the pixel electrode and the opposite electrode, a test circuit in the peripheral area, and a pseudo-diode in the peripheral area, electrically connected to the test circuit, and including a first transistor.

The first transistor may include a semiconductor layer, a gate electrode above the semiconductor layer, and a control electrode below the semiconductor layer.

The semiconductor layer may include an active region overlapping the gate electrode, and a drain region and a source region on respective sides of the active region, wherein the gate electrode is electrically connected to the drain region.

The pseudo-diode may further include a second transistor connected to the first transistor in series.

The display panel may further include pads in the peripheral area, and connection lines electrically connecting the pads to the test circuit and to the pseudo-diode.

The test circuit and the pseudo-diode may be adjacent to the pads.

The connection lines may include a first connection line electrically connecting a first pad of the pads to a control electrode of the first transistor, wherein the first pad and the first connection line are configured to transfer a control voltage from a power supply to the control electrode.

The control voltage may be configured to be adjusted such that a V-I curve of the pseudo-diode and a V-I curve of the light-emitting diode have similar shapes to each other.

The connection lines may include a second connection line electrically connecting a second pad of the pads to the test circuit and to the pseudo-diode, wherein the second pad and the second connection line are configured to transfer a test current from the pseudo-diode to a measurement circuit.

The connection lines may further include a third connection line electrically connected to a third pad of the pads that is grounded, and a fourth connection line electrically connected to a fourth pad of the pads that is grounded, wherein each of the third connection line and the fourth connection line surrounds at least a portion of the second connection line in the plan view.

According to one or more embodiments, a display panel includes a pixel in a display area, and a test pixel in a peripheral area, wherein the pixel includes a pixel circuit, and a light-emitting diode electrically connected to the pixel circuit, and wherein the test pixel includes a test circuit including a driving transistor including a driving gate electrically connected to a first node, a first terminal, and a second terminal electrically connected to a second node, a data writing transistor electrically connected between the first node and a data line, a compensation transistor electrically connected between the first node and a first voltage line, an initialization transistor electrically connected between the second node and a second voltage line, an emission control transistor electrically connected between the first terminal of the driving transistor and a third voltage line, a storage capacitor electrically connected between the first node and the second node, and a holding capacitor electrically connected between the third voltage line and the second node, and a pseudo-diode electrically connected to the test circuit, not configured to emit light, and electrically connected between the second node and a fourth voltage line.

The pseudo-diode may include a gate, a first terminal electrically connected to the gate of the pseudo-diode and to the second node, a second terminal electrically connected to the fourth voltage line, and a control electrode electrically connected to a fifth voltage line.

The fifth voltage line may be configured to transfer a control voltage from a power supply to the control electrode of the pseudo-diode, wherein the control voltage is configured to be adjusted such that a V-I curve of the pseudo-diode and a V-I curve of the light-emitting diode have similar shapes.

The test pixel may operate in a first period and a second period during one frame period, wherein the first period includes a first initialization period during which the compensation transistor and the initialization transistor are turned on, a first voltage is received from the first voltage line through the compensation transistor that is turned on, and a second voltage is received from the second voltage line through the initialization transistor that is turned on, and a second initialization period during which the initialization transistor is turned on, and the second voltage is received from the second voltage line through the initialization transistor that is turned on.

During the second period, the emission control transistor may be turned on, and a third voltage may be supplied to the first terminal of the driving transistor through the emission control transistor that is turned on.

The test pixel may be connected to a measurement circuit through a connection line electrically connecting the test pixel to a pad, wherein the measurement circuit is configured to measure a test current flowing through the pseudo-diode during the second period.

The pixel circuit may include a driving transistor including a driving gate electrically connected to a first node, a first terminal, and a second terminal electrically connected to a second node, a data writing transistor electrically connected between the first node of the pixel circuit and a data line, a compensation transistor electrically connected between the first node of the pixel circuit and a first voltage line, an initialization transistor electrically connected between the second node of the pixel circuit and a second voltage line, an emission control transistor electrically connected between the first terminal of the driving transistor of the pixel circuit and a third voltage line, a storage capacitor electrically connected between the first node of the pixel circuit and the second node of the pixel circuit, and a holding capacitor electrically connected between the third voltage line and the second node of the pixel circuit, wherein the light-emitting diode is electrically connected to the second node of the pixel circuit.

The pixel may be configured to operate in a first period and a second period during one frame period, wherein, during the second period, the emission control transistor of the pixel circuit is turned on, and a third voltage is supplied to the first terminal of the driving transistor of the pixel circuit through the emission control transistor that is turned on to allow the light-emitting diode to emit light.

The light-emitting diode may include a pixel electrode, an opposite electrode, and an emission layer between the pixel electrode and the opposite electrode, wherein a voltage applied to the opposite electrode of the light-emitting diode and a fourth voltage applied to the fourth voltage line have substantially a same magnitude.

The pixel may be provided in plurality including a first pixel for emitting light in a first color, and a second pixel for emitting light in a second color that is different from the first color, wherein the test pixel is provided in plurality including a first test pixel corresponding to the first pixel, and a second test pixel corresponding to the second pixel.

BRIEF DESCRIPTION OF THE DRAWINGS

The above and other aspects of embodiments of the disclosure will be more apparent from the following description taken in conjunction with the accompanying drawings, in which.

DETAILED DESCRIPTION

Figure 1:
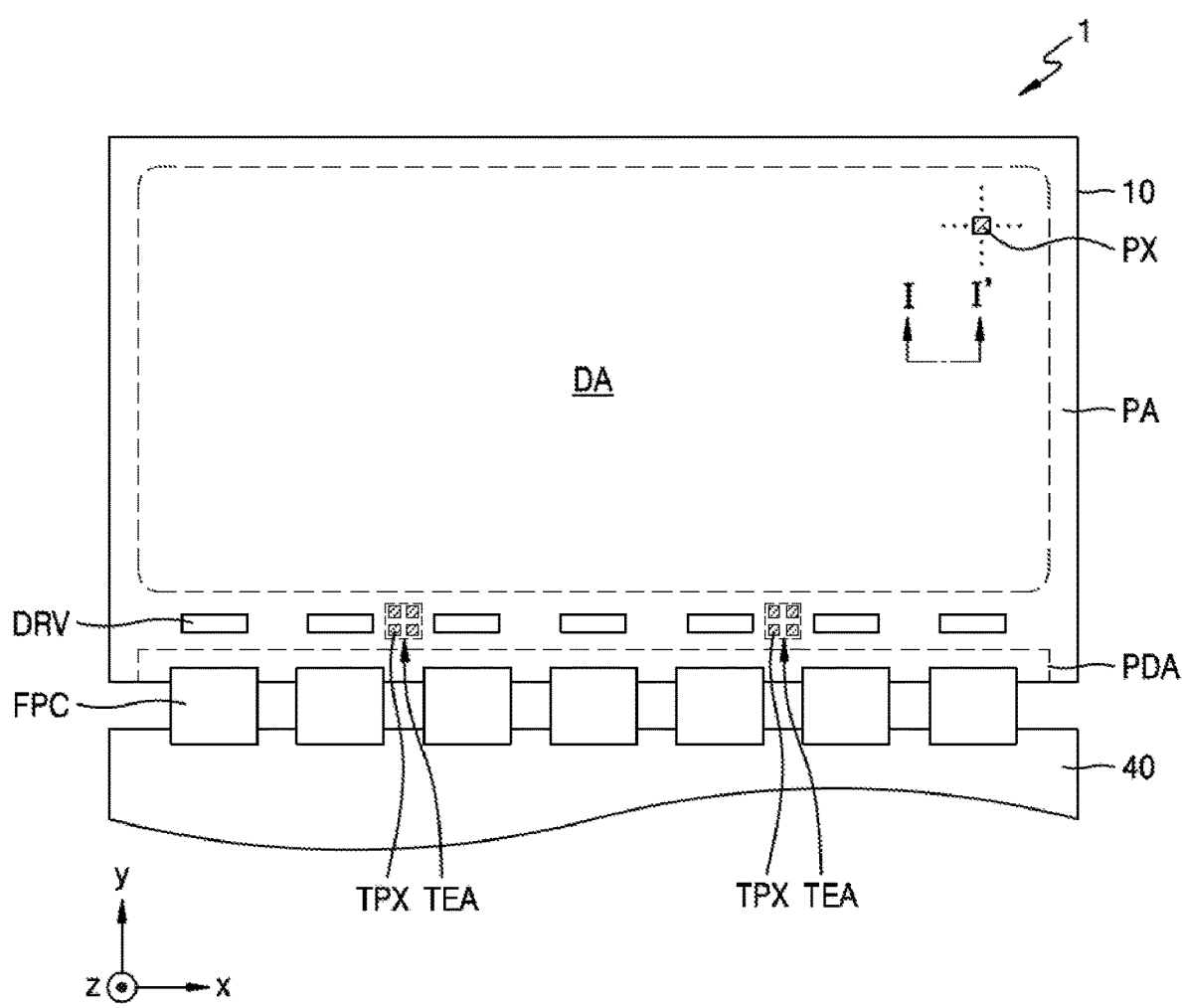
FIG. 1 is a schematic plan view of a display device according to one or more embodiments.

Aspects of some embodiments of the present disclosure and methods of accomplishing the same may be understood more readily by reference to the detailed description of embodiments and the accompanying drawings. The described embodiments are provided as examples so that this disclosure will be thorough and complete, and will fully convey the aspects of the present disclosure to those skilled in the art. Accordingly, processes, elements, and techniques that are redundant, that are unrelated or irrelevant to the description of the embodiments, or that are not necessary to those having ordinary skill in the art for a complete understanding of the aspects of the present disclosure may be omitted. Unless otherwise noted, like reference numerals, characters, or combinations thereof denote like elements throughout the attached drawings and the written description, and thus, repeated descriptions thereof may be omitted.

The described embodiments may have various modifications and may be embodied in different forms, and should not be construed as being limited to only the illustrated embodiments herein. The use of "can," "may," or "may not" in describing an embodiment corresponds to one or more embodiments of the present disclosure. The present disclosure covers all modifications, equivalents, and replacements within the idea and technical scope of the present disclosure. Further, each of the features of the various embodiments of the present disclosure may be combined with each other, in part or in whole, and technically various interlocking and driving are possible. Each embodiment may be implemented independently of each other or may be implemented together in an association.

In the drawings, the relative sizes of elements, layers, and regions may be exaggerated for clarity and/or descriptive purposes. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result of, for example, manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of elements, layers, or regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "(operatively or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component, or one or more intervening layers, regions, or components may be present. The one or more intervening components may include a switch, a resistor, a capacitor, and/or the like. In describing embodiments, an expression of connection indicates electrical connection unless explicitly described to be direct connection, and "directly connected/directly coupled," or "directly on," refers to one component directly being connected or coupled to another component, or being on another component, without an intermediate component.

In addition, in the present specification, when a portion of a layer, a film, an area, a plate, or the like is formed on another portion, a forming direction is not limited to an upper direction but includes forming the portion on a side surface or in a lower direction. When a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," and "immediately between" or "adjacent to" and "directly adjacent to" may be construed similarly. It will be understood that when an element or layer is referred to as being "between" two elements or layers, it can be the only element or layer between the two elements or layers, or one or more intervening elements or layers may also be present.

For the purposes of this disclosure, expressions, such as "at least one of," or "any one of," or "one or more of" when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XY, YZ, and XZ, or any variation thereof. Similarly, the expression, such as "at least one of A and B" and "at least one of A or B" may include A, B, or A and B. As used herein, "or" generally means "and/or," and the term "and/or" includes any and all combinations of one or more of the associated listed items. For example, the expression, such as "A and/or B" may include A, B, or A and B. Similarly, expressions, such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms do not correspond to a particular order, position, or superiority, and are used only used to distinguish one element, member, component, region, area, layer, section, or portion from another element, member, component, region, area, layer, section, or portion. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the direction x, the direction y, and/or the direction z are not limited to three axes of a rectangular coordinate system, and may be interpreted in a broader sense. For example, the direction x, the direction y, and the direction z may be perpendicular to one another, or may represent different directions that are not perpendicular to one another. The same applies for first, second, and/or third directions.

The terminology used herein is for the purpose of describing embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. For example, "substantially" may include a range of ±5% of a corresponding value. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

In some embodiments well-known structures and devices may be described and illustrated in the accompanying drawings in relation to one or more functional blocks (e.g., block diagrams), units, and/or modules to avoid unnecessarily obscuring various embodiments. Those skilled in the art will understand that such block, unit, and/or module are/is physically implemented by a logic circuit, an individual component, a microprocessor, a hard wire circuit, a memory element, a line connection, and other electronic circuits. This may be formed using a semiconductor-based manufacturing technique or other manufacturing techniques. The block, unit, and/or module implemented by a microprocessor or other similar hardware may be programmed and controlled using software to perform various functions discussed herein, optionally may be driven by firmware and/or software. In addition, each block, unit, and/or module may be implemented by dedicated hardware, or a combination of dedicated hardware that performs some functions and a processor (for example, one or more programmed microprocessors and related circuits) that performs a function different from those of the dedicated hardware. In addition, in some embodiments, the block, unit, and/or module may be physically separated into two or more interactive individual blocks, units, and/or modules without departing from the scope of the present disclosure. In addition, in some embodiments, the block, unit and/or module may be physically combined into more complex blocks, units, and/or modules without departing from the scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

A display device according to one or more embodiments may be implemented as an electronic device, such as a smartphone, a mobile phone, a smartwatch, a navigation device, a game console, a television (TV), an automotive head unit, a notebook computer, a laptop computer, a tablet computer, a portable multimedia player (PMP), a personal digital assistant (PDA), etc. In addition, the display device may be a flexible device.

FIG. 1 is a schematic plan view of a display device 1 according to one or more embodiments.

Referring to FIG. 1, the display device 1 may include a display panel 10 for displaying an image. The display panel 10 may include a display area DA in which a plurality of pixels PX are arranged, and a peripheral area PA surrounding at least a portion of the display area DA (e.g., in plan view). The peripheral area PA may include a pad area PDA adjacent to one side boundary of the peripheral area PA and a test pixel area TEA arranged between the display area DA and the pad area PDA.

The display area DA is an area for displaying an image, and a plurality of pixels PX may be arranged in various forms in the display area DA. For example, the pixels PX may be arranged in various forms, such as a stripe arrangement, a PENTILE™ arrangement (e.g., a diamond arrangement, a RGBG matrix structure, a PENTILE™ matrix structure, a PENTILE™ structure, or an RGBG structure, PENTILE™ being a registered trademark of Samsung Display Co., Ltd., Republic of Korea) and a mosaic arrangement, to display an image. Each of the pixels PX may include a light-emitting diode for emitting red, green, blue, or white light, and the light-emitting diode may be electrically connected to a pixel circuit. The pixel circuit and the light-emitting diode may be arranged in the display area DA. The pixel circuit may include transistors and capacitors.

The display area DA may have a rectangular shape in a plan view. In some embodiments, the display area DA may have a circular shape, an oval shape, other polygonal shape, or an atypical shape. The display area DA may have round corners.

As shown in FIG. 1, the display area DA may have a shape in which a length in a first direction (a direction x) is greater than a length in a second direction (a direction y). In one or more other embodiments, the display area DA may have a shape in which a length in a first direction (e.g., the direction x) is less than a length in a second direction (e.g., the direction y).

The peripheral area PA may be a non-display area in which pixels PX are not arranged. Various conductive lines configured to transmit electrical signals to be applied to the display area DA, and outer circuits electrically connected to pixel circuits of the pixels PX, may be arranged in the peripheral area PA. For example, driving circuits DRV configured to control some signals applied to the pixels PX may be arranged in the peripheral area PA. In some embodiments, the driving circuits DRV may be data drivers.

The peripheral area PA may have the pad area PDA adjacent to one side boundary of the peripheral area PA and having a plurality of pads arranged therein. The plurality of pads may be exposed without being covered by an insulating layer, and thus may be electrically connected to a circuit board 40 through a flexible printed circuit board FPC.

A test pixel TPX may be arranged in the peripheral area PA. The test pixel TPX may include a pseudo-diode that has electrical characteristics that are similar to those of the light-emitting diode of the pixel PX but does not emit light, and the pseudo-diode may be electrically connected to a test circuit.

The test pixel TPX may include one or more test pixels TPX, and an area in which the test pixel TPX is arranged may be defined as the test pixel area TEA. In other words, the peripheral area PA may have the test pixel area TEA in which the test pixel TPX is arranged. The test pixel area TEA may be between the display area DA and the pad area PDA.

In some embodiments, the test pixel area TEA may include two or more test pixel areas TEA, and the test pixel areas TEA may be arranged between the driving circuits DRV. One or more test pixels TPX may be arranged in the test pixel area TEA.

The flexible printed circuit board FPC may electrically connect the display panel 10 to the circuit board 40. The flexible printed circuit board FPC may be bent to position the circuit board 40 behind the display panel 10. In some embodiments, the flexible printed circuit board FPC may be omitted, and the display panel 10 may include a flexible or bendable substrate, and thus, at least a portion of the peripheral area PA and the circuit board 40 may be overlapped with the display area DA by directly bending a portion of the substrate. Accordingly, the area of a non-emission area recognized by a user may be reduced.

Circuits for supplying signals and power to be transmitted to the pixel PX, the test pixel TPX, and the driving circuit DRV may be located on the circuit board 40. For example, a data driver configured to generate a data signal, a power supply configured to supply power, and a controller may be located on the circuit board 40.

Figure 2:
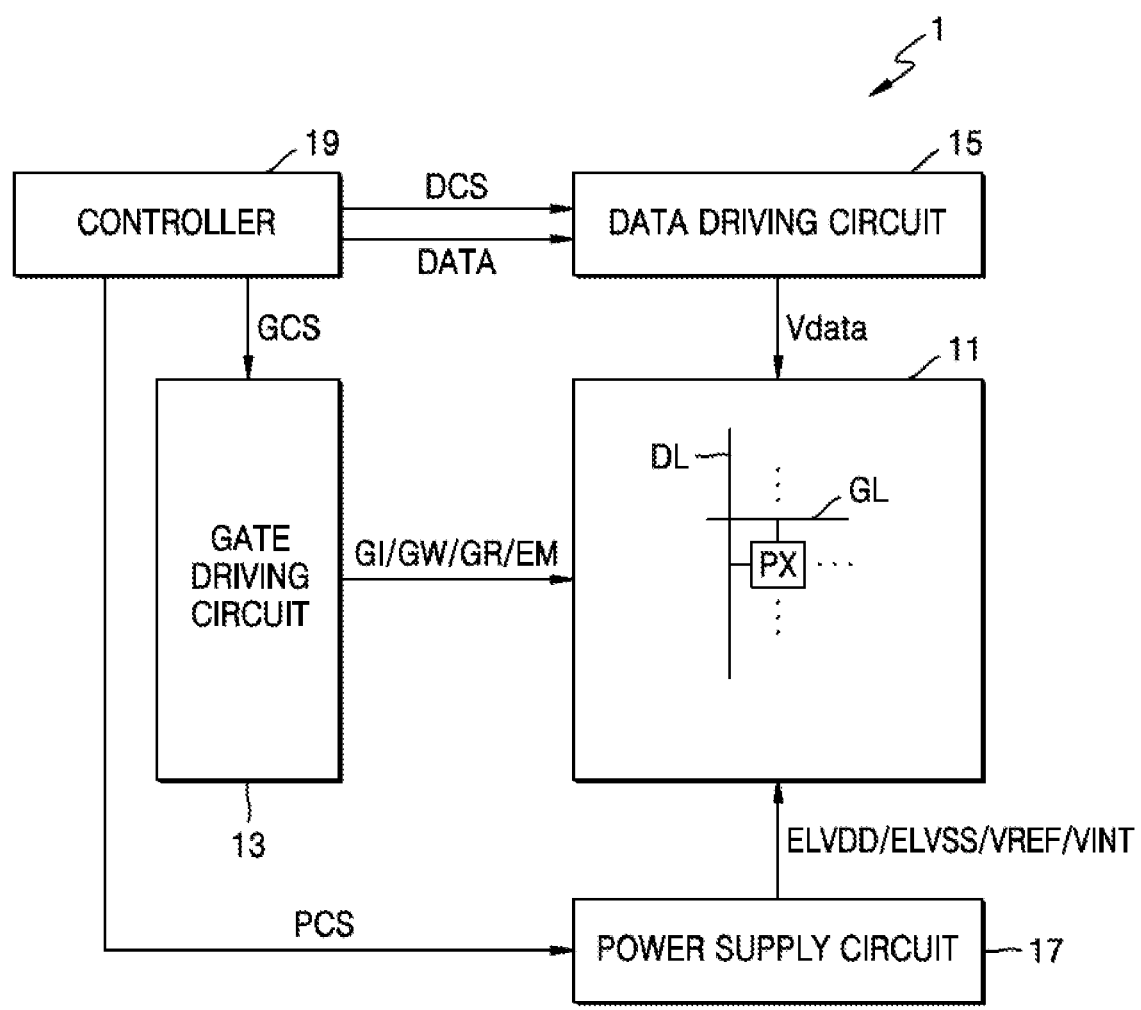
FIG. 2 is a schematic block diagram of a display device according to one or more embodiments.

FIG. 2 is a schematic block diagram of the display device 1 according to one or more embodiments.

Referring to FIG. 2, the display device 1 may include a pixel portion 11, a gate driver (e.g., gate driving circuit) 13, a data driver (e.g., data driving circuit) 15, a power supply (e.g., power supply circuit) 17, and a controller 19.

The pixel portion 11 may be provided in the display area DA (refer to FIG. 1). Some of the gate driver 13, the data driver 15, the power supply 17, and the controller 19 may be provided in the peripheral area PA (refer to FIG. 1) of the display panel 10 (refer to FIG. 1), and the others may be provided on the circuit board 40 (refer to FIG. 1).

The pixel portion 11 may include the plurality of pixels PX including a light-emitting diode and a pixel circuit electrically connected to the light-emitting diode. The pixel PX may be connected to at least one corresponding gate line among a plurality of gate lines GL, and to a corresponding data line among a plurality of data lines DL.

Each of the gate lines GL may extend in a first direction (the direction x, a row direction) and may be connected to pixels PX located in the same row. Each of the gate lines GL may be configured to transmit a gate signal to the pixels PX in the same row. Each of the data lines DL may extend in a second direction (the direction y, a column direction), and may be connected to pixels PX located in the same column. Each of the data lines DL may be configured to transmit a data signal to each of the pixels PX in the same column in synchronization with the gate signal.

The gate driver 13 may be connected to the gate lines GL, may be configured to generate gate signals in response to a control signal GCS from the controller 19, and may sequentially supply the gate signals to the gate lines GL. The gate lines GL may be connected to a gate of a transistor included in pixel circuits of the pixels PX. The gate signal may be a gate control signal for controlling the turn-on and turn-off of a transistor having a gate connected to the gate line GL. The gate signal may be a square wave signal including an on voltage at which the transistor may be turned on, and an off voltage at which the transistor may be turned off. In one or more embodiments, the on voltage may be a high-level voltage (a first level voltage) or a low-level voltage (a second level voltage).

Although the pixel PX is shown in FIG. 2 as being connected to one gate line GL, in one or more embodiments, the pixel PX may be connected to two or more gate lines, and the gate driver 13 may be configured to supply two or more gate signals having timings, at which an on voltage is applied to the corresponding gate lines, are different. For example, the pixel PX may be connected to first to third gate lines and to an emission control line, and the gate driver 13 may be configured to apply a first gate signal GW, a second gate signal GR, a third gate signal GI, and an emission control signal EM to first gate lines, second gate lines, third gate lines, and emission control lines, respectively. The emission control signal EM may be a gate control signal for controlling the turn-on and turn-off of a transistor having a gate connected to the emission control line.

The data driver 15 may be connected to the plurality of data lines DL, and may be configured to supply a data signal to the data lines DL in response to a control signal DCS from the controller 19. The data signal supplied to the data line DL may be supplied to the pixel PX to which the gate signal is supplied. The data driver 15 may be configured to convert input image data having a gray scale input from the controller 19 into a data signal in the form of voltage or current.

The power supply 17 may be configured to generate voltages, which are suitable to drive the pixel PX, in response to a control signal PCS from the controller 19. The power supply 17 may be configured to generate a first driving voltage ELVDD and a second driving voltage ELVSS (a common voltage), and may supply the same to the pixels PX. The first driving voltage ELVDD may be a high-level voltage provided to a first electrode (a pixel electrode or an anode) of the light-emitting diode included in the pixel PX. The second driving voltage ELVSS may be a low-level voltage provided to a second electrode (an opposite electrode or a cathode) of the light-emitting diode included in the pixel PX. The power supply 17 may be configured to generate a reference voltage VREF and an initialization voltage VINT, and may supply the same to the pixels PX.

A voltage level of the first driving voltage ELVDD may be higher than a voltage level of the second driving voltage ELVSS. A voltage level of the reference voltage VREF may be lower than the voltage level of the first driving voltage ELVDD. A voltage level of the initialization voltage VINT may be lower than the voltage level of the second driving voltage ELVSS.

The controller 19 may generate the control signals GCS, DCS, and PCS, based on signals input from the outside, and may respectively supply the same to the gate driver 13, the data driver 15, and the power supply 17. The control signal GCS output to the gate driver 13 may include a plurality of clock signals and a gate start signal. The control signal DCS output to the data driver 15 may include a source start signal and clock signals.

A portion of the gate driver 13, or the entire gate driver 13, may be directly formed in the peripheral area PA of a substrate during a process of forming a transistor of the pixel circuit in the display area DA of a substrate. The data driver 15, the power supply 17, and the controller 19 may each be an individual integrated circuit chip, or may be collectively formed in a single integrated circuit chip, and may be located on the flexible printed circuit board FPC (refer to FIG. 1) or the circuit board 40 (refer to FIG. 1) electrically connected to a pad located on one side of the substrate. In one or more other embodiments, the data driver 15, the power supply 17, and the controller 19 may be directly located on the substrate in a chip-on-glass (COG) or chip-on-plastic (COP) manner.

In addition, the gate driver 13, the data driver 15, and the power supply 17 may be configured to generate signals and voltages that are suitable to drive the test pixel TPX (refer to FIG. 1), in response to the control signals GCS, DCS, and PCS from the controller 19.

Figure 3:
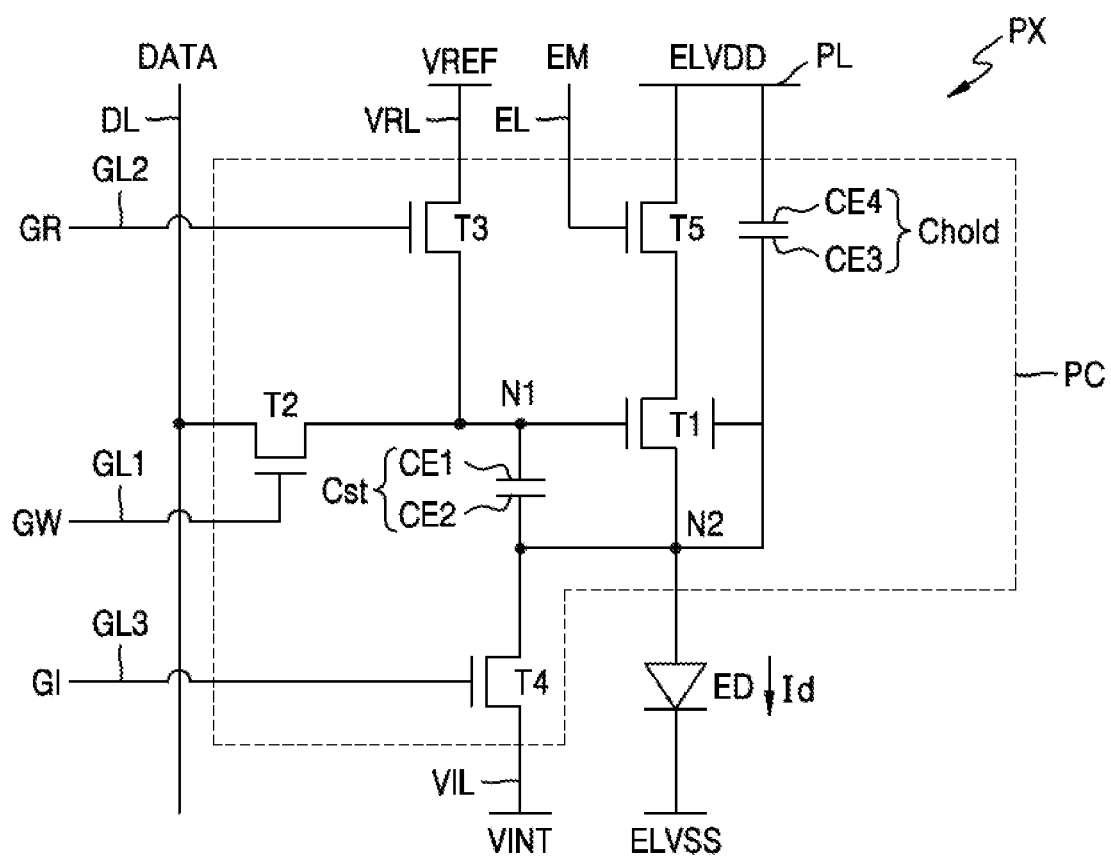
FIG. 3 is a schematic equivalent circuit diagram of a pixel included in a display panel according to one or more embodiments.

FIG. 3 is a schematic equivalent circuit diagram of the pixel PX included in a display panel according to one or more embodiments.

Referring to FIG. 3, the pixel PX may include a light-emitting diode ED, which is a display element, and a pixel circuit PC connected to the light-emitting diode ED. The pixel circuit PC may include first to fifth transistors T1 to T5, a storage capacitor Cst, and a holding capacitor Chold.

The first transistor T1 may be a driving transistor configured to output a driving current Id in response to a data signal, and the second to fifth transistors T2 to T5 may be switching transistors configured to transmit a signal. A first terminal (a first electrode) of each of the first to fifth transistors T1 to T5 may be source or drain, and a second terminal (a second electrode) thereof may be a terminal different from the first terminal. For example, if the first terminal is drain, the second terminal may be source. A node to which a first gate of the first transistor T1 is connected may be defined as a first node N1, and a node to which a second terminal of the first transistor T1 is connected may be defined as a second node N2.

The pixel circuit PC of the pixel PX may be connected to a first gate line GL1 configured to transmit the first gate signal GW, a second gate line GL2 configured to transmit the second gate signal GR, a third gate line GL3 configured to transmit the third gate signal GI, an emission control line EL configured to transmit the emission control signal EM, and the data line DL configured to transmit a data signal DATA. In addition, the pixel circuit PC may be connected to a driving voltage line PL configured to transfer the first driving voltage ELVDD, an initialization voltage line VIL configured to transfer the initialization voltage VINT, and a reference voltage line VRL configured to transfer the reference voltage VREF.

The first transistor T1 (a driving transistor) may be connected between the driving voltage line PL and the second node N2. The first transistor T1 may include a gate, a first terminal, and a second terminal connected to the second node N2. The gate of the first transistor T1 may include a first gate (a driving gate) connected to the first node N1 and a second gate connected to the second node N2. The first gate and the second gate may be located on different layers, and may face each other. For example, the first gate and the second gate of the first transistor T1 may face each other with a semiconductor layer therebetween. The first terminal of the first transistor T1 may be connected to the driving voltage line PL via the fifth transistor T5, and the second terminal of the first transistor T1 may be connected to a first electrode of the light-emitting diode ED. The first transistor T1 may be configured to receive the data signal DATA according to a switching operation of the second transistor T2, and may control an amount of driving current Id flowing to the light-emitting diode ED.

The second transistor T2 (a data writing transistor) may be connected between the data line DL and the first node N1. The second transistor T2 may include a gate connected to the first gate line GL1, a first terminal connected to the data line DL, and a second terminal connected to the first node N1. The second transistor T2 may be turned on by the first gate signal GW transmitted through the first gate line GL1 to electrically connect the data line DL to the first node N1, and to transmit the data signal DATA transmitted through the data line DL to the first node N1.

The third transistor T3 (a compensation transistor) may be connected between the first node N1 and the reference voltage line VRL. The third transistor T3 may include a gate connected to the second gate line GL2, a first terminal connected to the first node N1, and a second terminal connected to the reference voltage line VRL. The third transistor T3 may be turned on by the second gate signal GR transmitted through the second gate line GL2 to transfer the reference voltage VREF transferred through the reference voltage line VRL to the first node N1.

The fourth transistor T4 (an initialization transistor) may be connected between the first transistor T1 and the initialization voltage line VIL. The fourth transistor T4 may include a gate connected to the third gate line GL3, a first terminal connected to the second node N2, and a second terminal connected to the initialization voltage line VIL. The fourth transistor T4 may be turned on by the third gate signal GI transmitted through the third gate line GL3 to transfer the initialization voltage VINT transferred through the initialization voltage line VIL to the second node N2.

The fifth transistor T5 (an emission control transistor) may be connected between the driving voltage line PL and the first transistor T1. The fifth transistor T5 may include a gate connected to the emission control line EL, a first terminal connected to the driving voltage line PL, and a second terminal connected to the first terminal of the first transistor T1. The fifth transistor T5 may be turned on or turned off according to the emission control signal EM transmitted through the emission control line EL.

The storage capacitor Cst may be connected between the first node N1 and the second node N2. A first electrode CE1 of the storage capacitor Cst may be connected to the first node N1, and a second electrode CE2 of the storage capacitor Cst may be connected to the second node N2. The storage capacitor Cst may store a voltage corresponding to a threshold voltage of the first transistor T1 and a data signal.

The holding capacitor Chold may be connected between the driving voltage line PL and the second node N2. A third electrode CE3 of the holding capacitor Chold may be connected to the second node N2, and a fourth electrode CE4 of the holding capacitor Chold may be connected to the driving voltage line PL. In some embodiments, capacitance of the storage capacitor Cst may be greater than capacitance of the holding capacitor Chold.

The light-emitting diode ED may include a pixel electrode (a first electrode or an anode) connected to the second node N2, and an opposite electrode (a second electrode or a cathode) facing the pixel electrode, and the opposite electrode may receive the second driving voltage ELVSS. The opposite electrode may be a common electrode common to the plurality of pixels PX.

Figure 4:
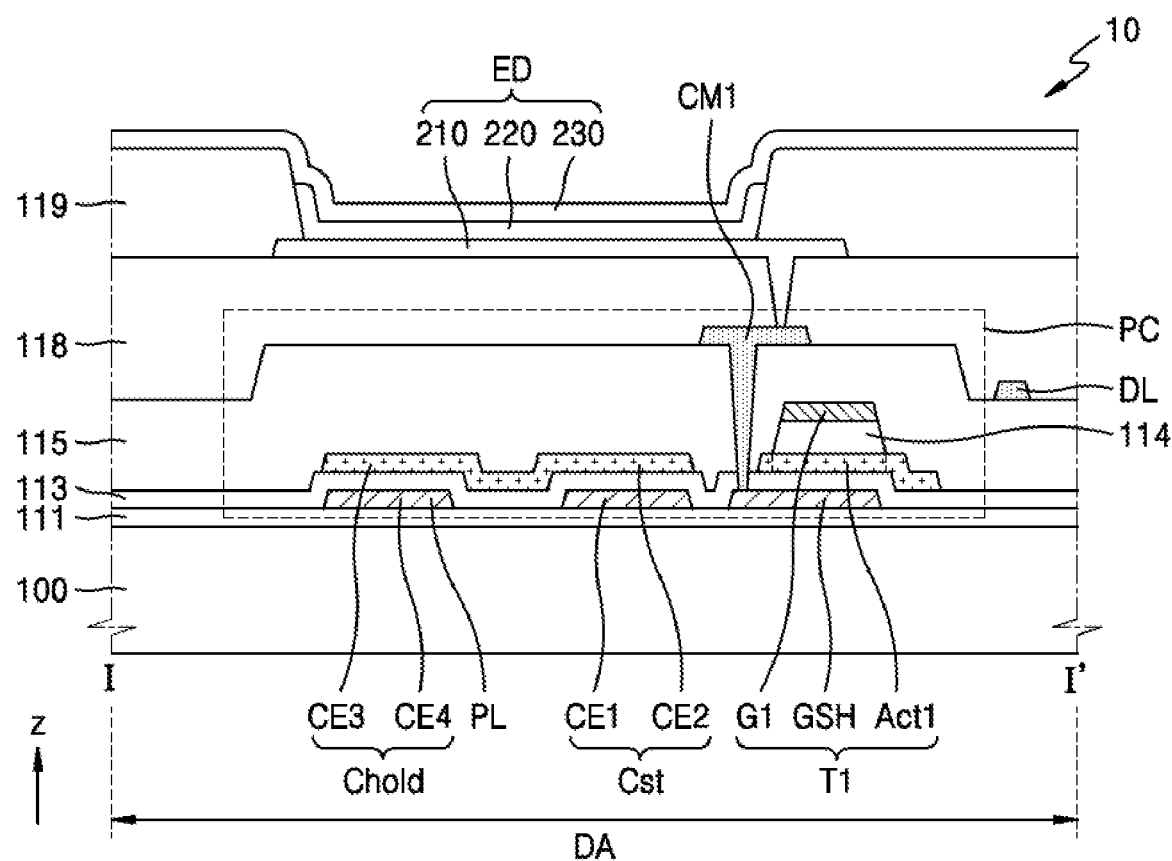
FIG. 4 is a schematic cross-sectional view of a display panel according to one or more embodiments.

FIG. 4 is a schematic cross-sectional view of the display panel 10 according to one or more embodiments.

Referring to FIG. 4, the display panel 10 may include a substrate 100. The substrate 100 may include the display area DA and the peripheral area PA (refer to FIG. 1) surrounding at least a portion of the display area DA. The light-emitting diode ED, which is a display element, and the pixel circuit PC electrically connected to the light-emitting diode ED, may be arranged in the display area DA.

The substrate 100 may include a glass material, a ceramic material, or a metal material. The substrate 100 may include a flexible or bendable material. If the substrate 100 is flexible or bendable, the substrate 100 may include polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate.

The substrate 100 may have a single-layer or multi-layer structure including the above material. In some embodiments, the substrate 100 may have a multi-layer structure including an inorganic layer between organic layers.

A barrier layer 111 may be located on the substrate 100. The barrier layer 111 may prevent or reduce penetration of impurities from below the substrate 100. The barrier layer 111 may have a single-layer or multi-layer structure including an inorganic material, such as silicon oxide, silicon nitride, or silicon oxynitride.

The pixel circuit PC may be located on the barrier layer 111. The pixel circuit PC may include transistors and capacitors. As an example, FIG. 4 shows the pixel circuit PC including the first transistor T1, the storage capacitor Cst, and the holding capacitor Chold.

A first conductive layer including the first electrode CE1 of the storage capacitor Cst, the fourth electrode CE4 of the holding capacitor Chold, and a shield layer GSH may be located on the barrier layer 111. The first electrode CE1, the fourth electrode CE4, and the shield layer GSH may include a conductive material, such as molybdenum (Mo), aluminum (Al), copper (Cu), titanium (Ti), etc., and may have a multi-layer or single-layer structure including the above-described material.

The first electrode CE1 of the storage capacitor Cst may have an isolated shape. The first electrode CE1 may overlap the second electrode CE2 located on a first insulating layer 113, thereby constituting the storage capacitor Cst. In some embodiments, the area of the first electrode CE1 may be greater than the area of the fourth electrode CE4.

The shield layer GSH may overlap a first gate electrode G1 and a first active region Act1 of the first transistor T1, described further below, and thus may prevent or reduce incidence of external light on the first active region Act1. In some embodiments, the shield layer GSH may be electrically connected to one of the electrodes of the storage capacitor Cst. In some embodiments, the shield layer GSH may serve as a bottom gate electrode of the first transistor T1.

The first insulating layer 113 may cover the first conductive layer, and may be located on the barrier layer 111. The first insulating layer 113 may include an insulating material. For example, the first insulating layer 113 may have a single-layer or multi-layer structure including an inorganic material, such as silicon oxide, silicon nitride, or silicon oxynitride. The first insulating layer 113 may reduce or prevent the likelihood of diffusion of metal atoms or impurities from the substrate 100 or the like into a first semiconductor layer above.

The first semiconductor layer may be located on the first insulating layer 113. The first semiconductor layer may include the first active region Act1 of the first transistor T1. The first semiconductor layer may include an oxide-based semiconductor material, for example, oxide of at least one material selected from the group including indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and/or zinc (Zn).

Because such an oxide-based semiconductor material has a relatively wide band gap and relatively low leakage current, a voltage drop is not significant even if a driving time of a transistor is long, and accordingly, a change in luminance due to the voltage drop is not significant even during low-frequency driving.

In some embodiments, as shown in FIG. 4, the first semiconductor layer may include the second electrode CE2 of the storage capacitor Cst, and the third electrode CE3 of the holding capacitor Chold. In some embodiments, the second electrode CE2 of the storage capacitor Cst and the third electrode CE3 of the holding capacitor Chold may be included in another conductive layer above or below the first conductive layer, for example, a second conductive layer.

The second electrode CE2 of the storage capacitor Cst may overlap the first electrode CE1. The third electrode CE3 of the holding capacitor Chold may overlap the fourth electrode CE4. The second electrode CE2 and the third electrode CE3 may be integrally formed with each other.

In some embodiments, the area where the first electrode CE1 and the second electrode CE2 overlap each other may be greater than the area where the third electrode CE3 and the fourth electrode CE4 overlap each other, so that capacitance of the storage capacitor Cst may be greater than capacitance of the holding capacitor Chold.

A gate-insulating layer 114 may be located on the first semiconductor layer. The gate-insulating layer 114 may include an insulating material. The gate-insulating layer 114 may have a single-layer or multi-layer structure including an inorganic material, such as silicon oxide, silicon nitride, or silicon oxynitride. The gate-insulating layer 114 may be patterned along a shape of a second conductive layer located thereon, and thus may have a shape corresponding to the shape of the second conductive layer.

The second conductive layer may be on the gate-insulating layer 114. The second conductive layer may include the first gate electrode G1 of the first transistor T1. The first gate electrode G1 may include a conductive material, such as molybdenum (Mo), aluminum (Al), copper (Cu), titanium (Ti), etc., and may have a multi-layer or single-layer structure including the above-described material.

The first gate electrode G1 may overlap the first active region Act1 of the first semiconductor layer. In addition, the first gate electrode G1 may overlap the shield layer GSH of the first conductive layer.

A second insulating layer 115 may be located on the first insulating layer 113 to cover the second conductive layer. The second insulating layer 115 may include an insulating material. The second insulating layer 115 may have a single-layer or multi-layer structure including an inorganic material, such as silicon oxide, silicon nitride, or silicon oxynitride.

A third conductive layer may be located on the second insulating layer 115. The third conductive layer may include the data line DL and a first connection electrode CM1. The data line DL and the first connection electrode CM1 may include a conductive material, such as molybdenum (Mo), aluminum (Al), copper (Cu), titanium (Ti), etc., and may have a multi-layer or single-layer structure including the above-described material.

As described above with reference to FIG. 3, the data line DL may be electrically connected to one terminal of the second transistor T2 of the pixel circuit PC to transmit the data signal DATA to the pixel PX.

The first connection electrode CM1 may be electrically connected to the shield layer GSH through a contact hole penetrating the first insulating layer 113 and the second insulating layer 115. The first connection electrode CM1 may be electrically connected to a pixel electrode 210 of the light-emitting diode ED described below. As described above with reference to FIG. 3, the first connection electrode CM1 may serve as the second node N2 electrically connecting the first transistor T1, the storage capacitor Cst, the holding capacitor Chold, and the light-emitting diode ED to one another.

A third insulating layer 118 may be located on the second insulating layer 115 to cover the third conductive layer. The third insulating layer 118 may include an organic insulating material. The third insulating layer 118 may include photoresist, benzocyclobutene (BCB), polyimide, hexamethyldisiloxane (HMDSO), poly(methyl methacrylate) (PMMA), polystyrene, a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or a mixture thereof.

The light-emitting diode ED may be on the third insulating layer 118. The light-emitting diode ED may include the pixel electrode 210, an opposite electrode 230, and an intermediate layer 220 between the pixel electrode 210 and the opposite electrode 230.

The pixel electrode 210 may be located on the third insulating layer 118. The pixel electrode 210 may be a (semi)transmissive electrode or a reflective electrode. In some embodiments, the pixel electrode 210 may include a reflective layer including silver (Ag), magnesium (Mg), aluminum (Al), platinum (Pt), palladium (Pd), gold (Au), nickel (Ni), neodymium (Nd), iridium (Ir), chromium (Cr), and/or a compound thereof, and a transparent or semitransparent electrode layer on the reflective layer. The transparent or semitransparent electrode layer may include at least one selected from the group including indium tin oxide (ITO), indium zinc oxide (IZO), zinc oxide (ZnO), indium oxide ($In_2O_3$), indium gallium oxide (IGO), and/or aluminum zinc oxide (AZO). In some embodiments, the pixel electrode 210 may have a structure of ITO/Ag/ITO.

A pixel-defining layer 119 may be located on the third insulating layer 118 to cover edges of the pixel electrode 210. The pixel-defining layer 119 may define an opening exposing a central portion of the pixel electrode 210. An emission area of the light-emitting diode ED may be defined by the opening.

The pixel-defining layer 119 may reduce or prevent the likelihood of an arc or the like occurring at the edges of the pixel electrode 210 by increasing a distance between the edges of the pixel electrode 210 and the opposite electrode 230. The pixel-defining layer 119 may include one or more organic insulating materials selected from the group including polyimide, polyamide, acrylic resin, BCB, and/or phenolic resin, and may be formed by a method, such as spin coating.

In some embodiments, the pixel-defining layer 119 may include a light-blocking material, and may be in black. The light-blocking material may include carbon black, carbon nanotubes, resin or paste including black dye, metal particles, for example, nickel, aluminum, molybdenum, and/or alloys thereof, metal oxide particles (e.g., chromium oxide), or metal nitride particles (e.g., chromium nitride).

The opposite electrode 230 may be located on the intermediate layer 220. The opposite electrode 230 may include metal having a relatively low work function, alloy, an electrically conductive compound, or any combination thereof. For example, the opposite electrode 230 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), indium tin oxide (ITO), indium zinc oxide (IZO), or any combination thereof. The opposite electrode 230 may be a transmissive electrode, a semi-transmissive electrode, or a reflective electrode. The opposite electrode 230 may be formed as a single body to correspond to a plurality of light-emitting diodes ED arranged in the display area DA.

The intermediate layer 220 may include a polymer organic material or low-molecular weight organic material for emitting light of a certain color. The intermediate layer 220 may further include a metal-containing compound, such as an organometallic compound, an inorganic material, such as quantum dots, and the like, in addition to various organic materials.

In some embodiments, the intermediate layer 220 may include an emission layer, and also may include a first functional layer and a second functional layer respectively under and on the emission layer. The first functional layer may include, for example, a hole transport layer (HTL), or an HTL and a hole injection layer (HIL). The second functional layer may include an electron transport layer (ETL) and/or an electron injection layer (EIL). The first functional layer and the second functional layer may be omitted. Each of the first functional layer and the second functional layer may be formed as a single body to correspond to the plurality of light-emitting diodes ED included in the display area DA.

In one or more embodiments, the intermediate layer 220 may include two or more emitting units sequentially stacked between the pixel electrode 210 and the opposite electrode 230, and a charge generation layer (CGL) between the two or more emitting units. If the intermediate layer 220 includes an emitting unit and a CGL, the light-emitting diode ED may be a tandem light-emitting element. The light-emitting diode ED may have a stacked structure of a plurality of emitting units, thereby improving color purity and emission efficiency.

In one or more other embodiments, an encapsulation layer may be located on the light-emitting diode ED. The encapsulation layer may include at least one inorganic encapsulation layer and at least one organic encapsulation layer. The inorganic encapsulation layer may include an insulating material. The inorganic encapsulation layer may include an inorganic material, such as silicon oxide, silicon nitride, or silicon oxynitride. The organic encapsulation layer may include an organic insulating material.

Figure 5:
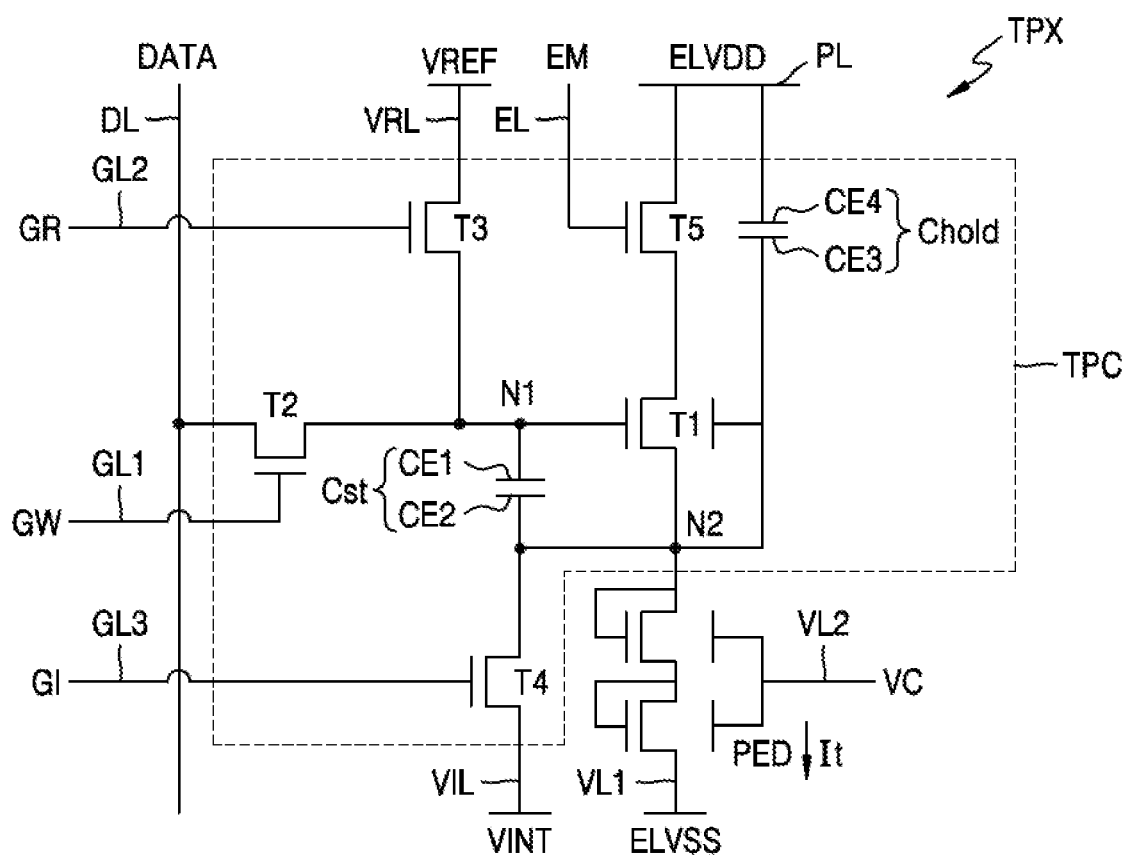
FIG. 5 is a schematic equivalent circuit diagram of a test pixel included in a display panel according to one or more embodiments.

FIG. 5 is a schematic equivalent circuit diagram of the test pixel TPX included in a display panel according to one or more embodiments.

Referring to FIG. 5, the test pixel TPX may include a test circuit TPC and a pseudo-diode PED connected to the test circuit TPC. The test circuit TPC may have the same or similar configurations as the pixel circuit PC of the pixel PX described above with reference to FIG. 3. For example, the test circuit TPC may include the first to fifth transistors T1 to T5, the storage capacitor Cst, and the holding capacitor Chold. The pseudo-diode PED may be a non-display element that has electrical characteristics that are similar to those of the light-emitting diode ED but does not emit light.

The test circuit TPC of the test pixel TPX may be connected to the first gate line GL1 configured to transmit the first gate signal GW, to the second gate line GL2 configured to transmit the second gate signal GR, to the third gate line GL3 configured to transmit the third gate signal GI, the emission control line EL configured to transmit the emission control signal EM, and to the data line DL configured to transmit the data signal DATA. In addition, the test circuit TPC may be connected to the reference voltage line VRL (a first voltage line) configured to transfer the reference voltage VREF, to the initialization voltage line VIL (a second voltage line) configured to transfer the initialization voltage VINT, and to the driving voltage line PL (a third voltage line) configured to transfer the first driving voltage ELVDD.

The first transistor T1 may be connected between the driving voltage line PL and the second node N2. The first transistor T1 may include a gate, a first terminal, and a second terminal connected to the second node N2. The gate of the first transistor T1 may include a first gate (a driving gate) connected to the first node N1, and a second gate connected to the second node N2. The first gate and the second gate may be located on different layers to face each other. For example, the first gate and the second gate of the first transistor T1 may face each other with a semiconductor layer therebetween. The first terminal of the first transistor T1 may be connected to the driving voltage line PL via the fifth transistor T5, and the second terminal of the first transistor T1 may be connected to a first terminal of the pseudo-diode PED. The first transistor T1 may be configured to receive the data signal DATA according to a switching operation of the second transistor T2 and control an amount of test current It flowing to the pseudo-diode PED.

The second transistor T2 may be connected between the data line DL and the first node N1. The second transistor T2 may include a gate connected to the first gate line GL1, a first terminal connected to the data line DL, and a second terminal connected to the first node N1. The second transistor T2 may be turned on by the first gate signal GW transmitted through the first gate line GL1 to electrically connect the data line DL to the first node N1, and may transmit the data signal DATA transmitted through the data line DL to the first node N1.

The third transistor T3 may be connected between the first node N1 and the reference voltage line VRL. The third transistor T3 may include a gate connected to the second gate line GL2, a first terminal connected to the first node N1, and a second terminal connected to the reference voltage line VRL. The third transistor T3 may be turned on by the second gate signal GR transmitted through the second gate line GL2 to transfer the reference voltage VREF transferred through the reference voltage line VRL to the first node N1.

The fourth transistor T4 may be connected between the first transistor T1 and the initialization voltage line VIL. The fourth transistor T4 may include a gate connected to the third gate line GL3, a first terminal connected to the second node N2, and a second terminal connected to the initialization voltage line VIL. The fourth transistor T4 may be turned on by the third gate signal GI transmitted through the third gate line GL3 to transfer the initialization voltage VINT transferred through the initialization voltage line VIL to the second node N2.

The fifth transistor T5 may be connected between the driving voltage line PL and the first transistor T1. The fifth transistor T5 may include a gate connected to the emission control line EL, a first terminal connected to the driving voltage line PL, and a second terminal connected to the first terminal of the first transistor T1. The fifth transistor T5 may be turned on or turned off according to the emission control signal EM transmitted through the emission control line EL.

The storage capacitor Cst may be connected between the first node N1 and the second node N2. The first electrode CE1 of the storage capacitor Cst may be connected to the first node N1, and the second electrode CE2 of the storage capacitor Cst may be connected to the second node N2. The storage capacitor Cst may store a voltage corresponding to a threshold voltage of the first transistor T1 and a data signal.

The holding capacitor Chold may be connected between the driving voltage line PL and the second node N2. The third electrode CE3 of the holding capacitor Chold may be connected to the second node N2, and the fourth electrode CE4 of the holding capacitor Chold may be connected to the driving voltage line PL. In some embodiments, capacitance of the storage capacitor Cst may be greater than capacitance of the holding capacitor Chold.

The pseudo-diode PED may be one or more transistors including a first terminal (a first electrode) connected to the second node N2, a second terminal (a second electrode) connected to a common voltage line VL1 (a fourth voltage line), a gate, and a control electrode connected to a control voltage line VL2 (a fifth voltage line). For example, the pseudo-diode PED may be a pair of transistors connected in series and each including a control electrode.

The gate and the control electrode of the pseudo-diode PED may face each other with a second semiconductor layer therebetween. The gate may be connected to the first terminal of the pseudo-diode PED, and the control electrode may be connected to the control voltage line VL2 configured to transfer a control voltage VC. The second terminal of the pseudo-diode PED may be connected to the common voltage line VL1 to receive the second driving voltage ELVSS.

The control voltage VC applied to the control electrode of the pseudo-diode PED may be adjusted, and thus, the pseudo-diode PED may have electrical characteristics that are similar to, or the same as, those of the light-emitting diode ED. For example, the control voltage VC applied to the control electrode of the pseudo-diode PED may be adjusted such that a V-I curve of the pseudo-diode PED has a similar shape to a V-I curve of the light-emitting diode ED. The control voltage VC may be adjusted so that the V-I curve of the pseudo-diode PED has positive current value at low voltages near 0 V, and the current value increases as the voltage increases. Accordingly, degradation curves of transistors constituting the pixel circuit PC (refer to FIG. 3) of the pixel PX (refer to FIG. 3) may be easily measured using the test pixel TPX. For example, a degradation curve of the test pixel TPX may be obtained by measuring the test current It output by the first transistor T1 of the test circuit TPC. Because the test pixel TPX is provided for each display panel, variations for each display panel may be reduced by predicting degradation of transistors for each display panel and by applying additional compensation.

Figure 6:
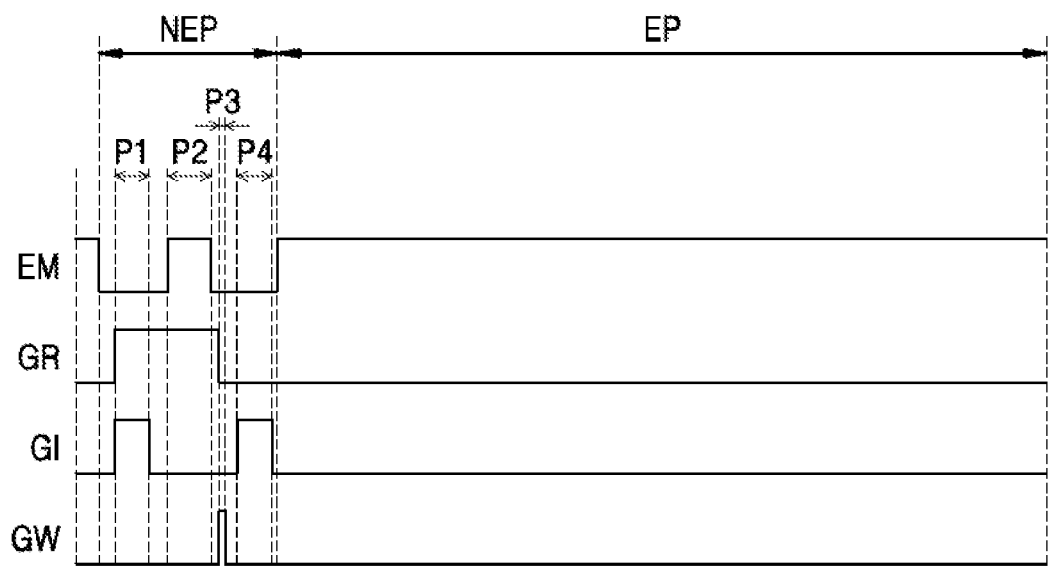
FIG. 6 is a diagram showing waveforms of signals for describing operations of the pixel shown in FIG. 3.
Figure 7:
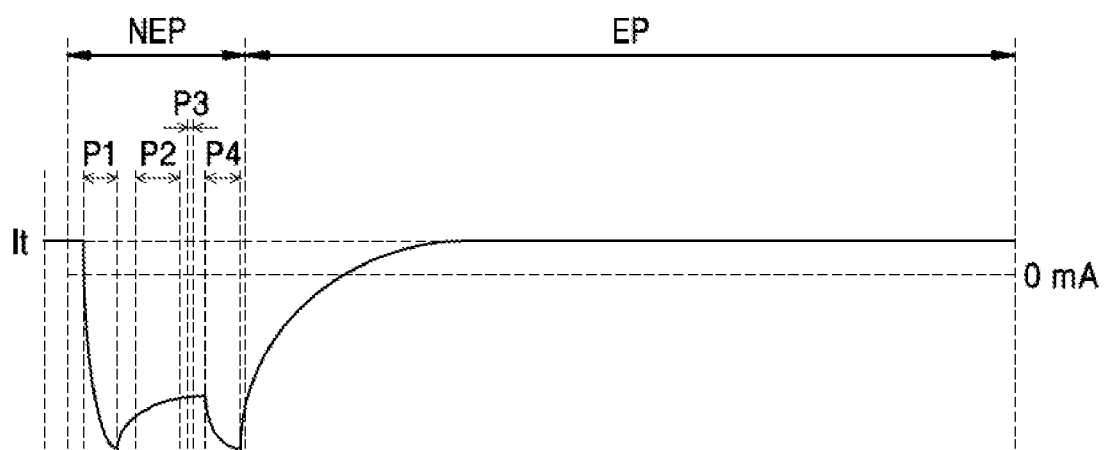
FIG. 7 is a diagram showing a test current measured during signal periods shown in FIG. 6.

FIG. 6 is a diagram showing waveform diagrams of signals for describing operations of the pixel shown in FIG. 3. FIG. 7 is a diagram showing a test current measured during signal periods shown in FIG. 6. Although FIG. 6 shows waveform diagrams of signals for describing operations of the pixel PX (refer to FIG. 3), the test pixel TPX shown in FIG. 5 may also operate according to the same signals.

Referring to FIGS. 3 and 6 together, the pixel PX may display an image for each frame period. One frame period may include a non-emission period NEP (a first period) during which the pixel PX does not emit light, and an emission period EP (a second period) during which the pixel PX emits light. The non-emission period NEP may include a first initialization period P1, a compensation period P2, a writing period P3, and a second initialization period P4.

Each of the first gate signal GW, the second gate signal GR, the third gate signal GI, and the emission control signal EM may have a high-level voltage during some respective periods, and may have a low-level voltage during some respective periods. In this regard, the high-level voltage may be an on voltage for turning on a transistor, and the low-level voltage may be an off voltage for turning off a transistor.

During the first initialization period P1, the third gate signal GI of an on voltage may be supplied to the third gate line GL3, and the second gate signal GR of an on voltage may be supplied to the second gate line GL2. The first gate signal GW and the emission control signal EM may be supplied as an off voltage. The fourth transistor T4 may be turned on by the third gate signal GI, and the third transistor T3 may be turned on by the second gate signal GR. The first node N1, that is, the first gate of the first transistor T1, may be initialized to the reference voltage VREF by the turned-on third transistor T3. The second node N2, that is, the pixel electrode 210 (refer to FIG. 4) of the light-emitting diode ED, may be initialized to the initialization voltage VINT by the turned-on fourth transistor T4.

During the compensation period P2, the second gate signal GR of an on voltage may be supplied to the second gate line GL2, and the emission control signal EM of an on voltage may be supplied to the emission control line EL. The first gate signal GW and the third gate signal GI may be supplied as an off voltage. The second transistor T2 and the fourth transistor T4 may be turned off by the first gate signal GW and the third gate signal GI. The third transistor T3 may be turned on by the second gate signal GR, and the fifth transistor T5 may be turned on by the emission control signal EM. Accordingly, the reference voltage VREF may be supplied to the first node N1, and the first driving voltage ELVDD may be supplied to the first terminal of the first transistor T1, and thus, the first transistor T1 may be turned on. If a voltage applied to the second terminal of the first transistor T1 drops below a difference VREF-Vth between the reference voltage VREF and a threshold voltage Vth of the first transistor T1, the first transistor T1 may be turned off. A voltage corresponding to the threshold voltage Vth of the first transistor T1 may be stored in the storage capacitor Cst to compensate for the threshold voltage Vth of the first transistor T1.

During the writing period P3, the first gate signal GW of an on voltage may be supplied to the first gate line GL1 to turn on the second transistor T2. In this regard, the third transistor T3, the fourth transistor T4, and the fifth transistor T5 may be respectively turned off by the second gate signal GR, the third gate signal GI, and the emission control signal EM of an off voltage. The second transistor T2 may be configured to transmit the data signal DATA from the data line DL to the first node N1, that is, to the first gate of the first transistor T1. Accordingly, a voltage of the first node N1 may be changed from the reference voltage VREF to a voltage corresponding to the data signal DATA. In this regard, a voltage of the second node N2 may also be changed in response to an amount of change in the voltage of the first node N1. The voltage of the second node N2 may be determined according to a capacitance ratio between the storage capacitor Cst and the holding capacitor Chold. For example, a gate-source voltage Vgs of the first transistor T1, that is, a voltage difference between the first node N1 and the second node N2, may be expressed as Equation (1) below.

$$Vgs = \{(Chold/(Cst + Chold))(DATA - VREF) + Vth \quad (1)$$

During the second initialization period P4, the third gate signal GI of an on voltage may be supplied to the third gate line GL3. The first gate signal GW, the second gate signal GR, and the emission control signal EM may be supplied as an off voltage. The fourth transistor T4 may be turned on by the third gate signal GI to initialize the second node N2 (e.g., to initialize a pixel electrode 210 of the light-emitting diode ED) to the initialization voltage VINT. In this regard, the gate-source voltage Vgs of the first transistor T1 may be expressed as Equation (2) below.

$$Vgs = \{(Chold/(Cst + Chold))(DATA - VREF) + Vth - VINT \quad (2)$$

The light-emitting diode ED may be initialized by using the initialization voltage VINT before the emission period EP, and thus, a low-light phenomenon of the light-emitting diode ED may be effectively reduced or prevented at a low gray level, such as a black level. Accordingly, a high-quality image may be displayed by reducing a change in luminance of the light-emitting diode ED at a high temperature and a low gray level.

During the emission period EP, the emission control signal EM of an on voltage may be supplied to the emission control line EL. The first gate signal GW, the second gate signal GR, and the third gate signal GI may be supplied as an off voltage. The second transistor T2, the third transistor T3, and the fourth transistor T4 may be respectively turned off by the first gate signal GW, the second gate signal GR, and the third gate signal GI, and the fifth transistor T5 may be turned on by the emission control signal EM, and thus, the first driving voltage ELVDD may be supplied to the first terminal of the first transistor T1.

The first transistor T1 may output the driving current Id having a magnitude corresponding to the voltage stored in the storage capacitor Cst, and the light-emitting diode ED may emit light at a luminance corresponding to the magnitude of the driving current Id.

Referring to FIGS. 5 and 7, signals that are the same as or similar to those shown in FIG. 6 may be applied to the test pixel TPX. One frame period may include the non-emission period NEP and the emission period EP, and the non-emission period NEP may include the first initialization period P1, the compensation period P2, the writing period P3, and the second initialization period P4. As an example, FIG. 7 shows the test current It, which is output by the first transistor T1 of the test circuit TPC when the control voltage VC applied to the control electrode of the pseudo-diode PED of the test pixel TPX is about −2 V.

The test current It may have a negative value, that is, a value of about 0 mA or less, during the first initialization period P1 and the second initialization period P4 when the third gate signal GI of an on voltage is supplied to the third gate line GL3. Because the driving current Id output by the first transistor T1 of the pixel PX (refer to FIG. 3) has a positive value, the test current It may be measured during the emission period EP. That is, a measurement period of the test current It in the test pixel TPX may coincide with the emission period EP.

Figure 8:
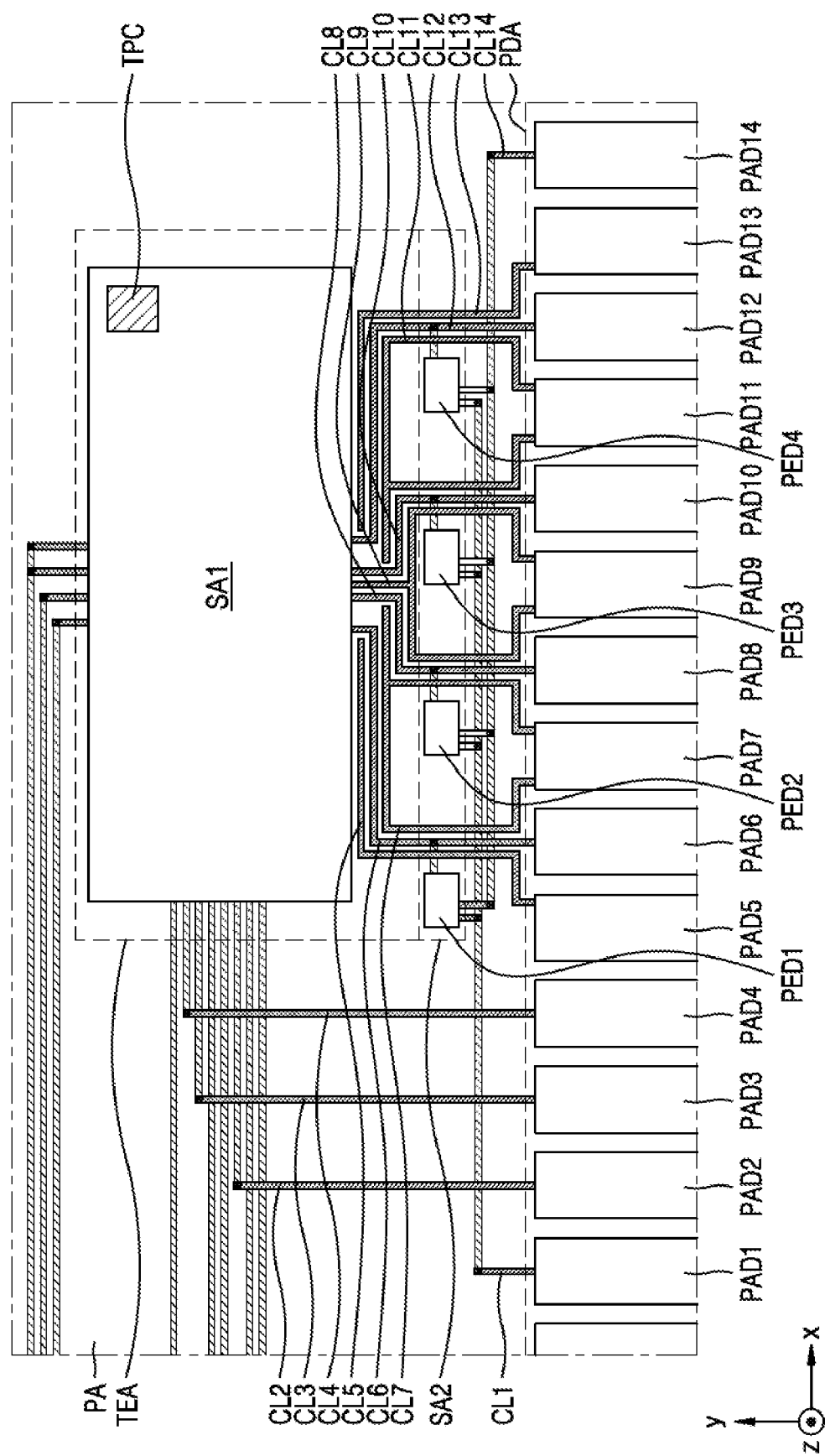
FIG. 8 is a schematic plan view of a portion of a display panel according to one or more embodiments.
Figure 9:
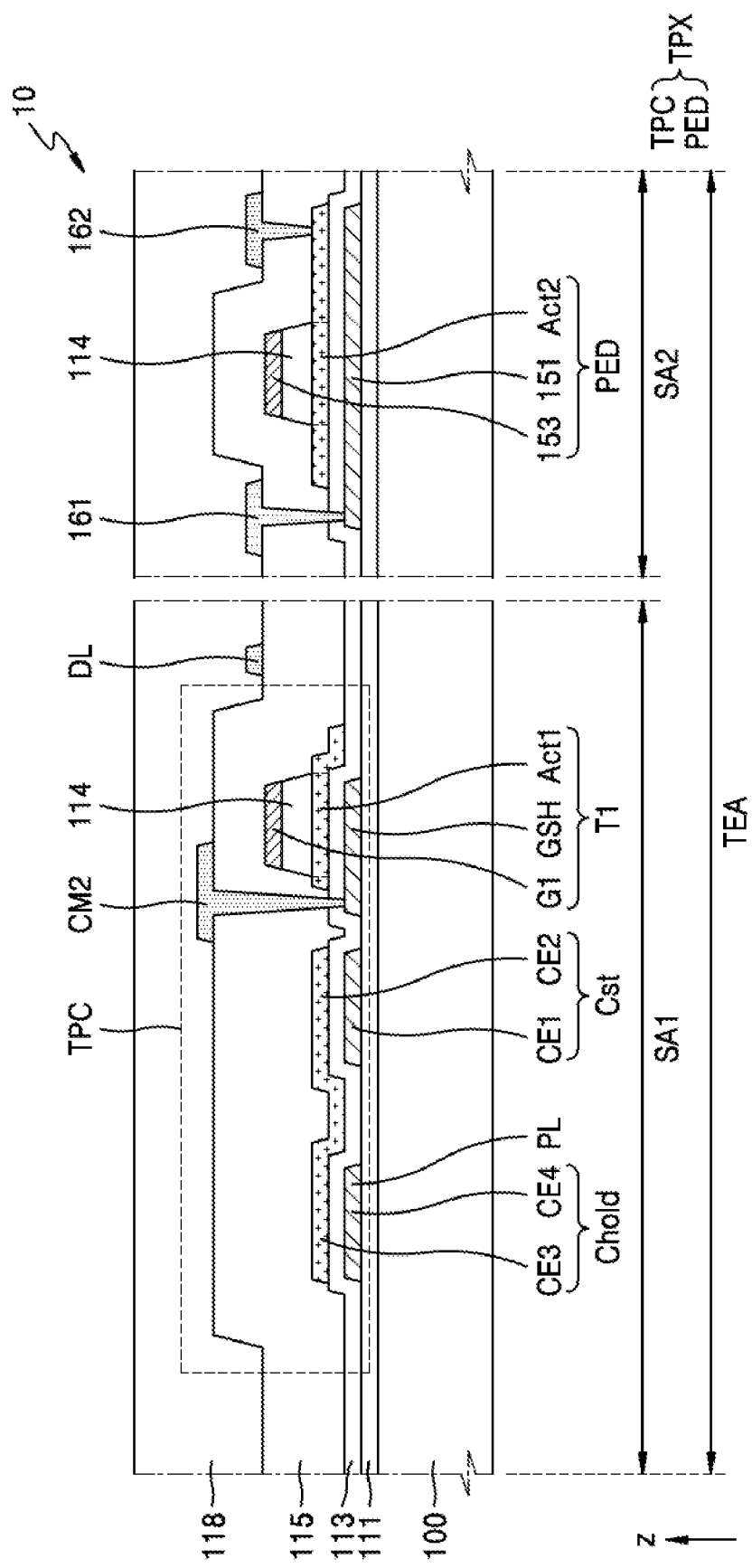
FIG. 9 is a schematic cross-sectional view of a display panel according to one or more embodiments.

FIG. 8 is a schematic plan view of a portion of a display panel 10 according to one or more embodiments. FIG. 9 is a schematic cross-sectional view of the display panel 10 according to one or more embodiments. FIG. 8 is an enlarged view of a portion of the peripheral area PA including the test pixel area TEA and the pad area PDA.

Referring to FIGS. 8 and 9, the peripheral area PA may include the test pixel area TEA and the pad area PDA. The test pixel area TEA may include a first sub-area SA1 in which test circuits TPC are arranged, and a second sub-area SA2 in which pseudo-diodes PED are arranged.

At least one test circuit TPC may be arranged in the first sub-area SA1. The test circuit TPC may have the same or similar structure as the pixel circuit PC (refer to FIG. 3) of the pixel PX (refer to FIG. 3) arranged in the display area DA (refer to FIG. 1). In some embodiments, a plurality of test circuits TPC may be arranged in the first sub-area SA1. For example, a first test circuit having the same or similar structure as a pixel circuit of a pixel emitting light in a first color, a second test circuit having the same or similar structure as a pixel circuit of a pixel emitting light in a second color, a third test circuit having the same or similar structure as a pixel circuit of a pixel emitting light in a third color, and a fourth test circuit having the same or similar structure as a pixel circuit of a black pixel may be arranged in the first sub-area SA1.

At least one pseudo-diode PED may be arranged in the second sub-area SA2. The pseudo-diode PED may have electrical characteristics similar to those of the light-emitting diode ED (refer to FIG. 3) of the pixel PX (refer to FIG. 3) arranged in the display area DA (refer to FIG. 1). In some embodiments, a plurality of pseudo-diodes PED may be arranged in the second sub-area SA2. For example, a first pseudo-diode PED1 electrically connected to the first test circuit, a second pseudo-diode PED2 electrically connected to the second test circuit, a third pseudo-diode PED3 electrically connected to the third test circuit, and a fourth pseudo-diode PED4 electrically connected to the fourth test circuit may be arranged in the second sub-area SA2. The first to fourth pseudo-diodes PED1 to PED4 may be apart from one another.

That is, a plurality of test pixels TPX may be arranged in the test pixel area TEA, and a first test pixel may correspond to the pixel PX (refer to FIG. 1) emitting light in a first color, a second test pixel may correspond to the pixel PX emitting light in a second color, a third test pixel may correspond to the pixel PX emitting light in a third color, and a fourth test pixel may correspond to the black pixel.

As shown in FIG. 9, the test pixel TPX may include the test circuit TPC arranged in the first sub-area SA1, and the pseudo-diode PED arranged in the second sub-area SA2. The test circuit TPC may include the first transistor T1, the storage capacitor Cst, and the holding capacitor Chold. As described above, the test circuit TPC has the same or similar structure as the pixel circuit PC described with reference to FIG. 3, and thus, a redundant description thereof is omitted, and differences are mainly described below.

In the second sub-area SA2, a control electrode 151 may be located on the barrier layer 111. The control electrode 151 may be located on the same layer as the first electrode CE1 of the storage capacitor Cst, the fourth electrode CE4 of the holding capacitor Chold, and the shield layer GSH of the test circuit TPC. For example, a first conductive layer may include the control electrode 151. The control electrode 151 may include a conductive material, such as molybdenum (Mo), aluminum (Al), copper (Cu), titanium (Ti), etc., and may have a multi-layer or single-layer structure including the above-described material.

The first insulating layer 113 may cover the control electrode 151, and may be located on the barrier layer 111. In the second sub-area SA2, a second semiconductor layer may be located on the first insulating layer 113. The second semiconductor layer may include a second active region Act2 of the pseudo-diode PED. The second semiconductor layer may be located on the same layer as the first active region Act1 of the first transistor T1. The second semiconductor layer may include an oxide-based semiconductor material, for example, oxide of at least one material selected from the group including indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and/or zinc (Zn).

The second semiconductor layer may include a drain region and a source region with the second active region Act2 located therebetween. The drain region and the source region may be interpreted as a first terminal and a second terminal of the pseudo-diode PED, respectively.

The gate-insulating layer 114 may be located on the second semiconductor layer. A pseudo-gate electrode 153 may be located on the gate-insulating layer 114. The pseudo-gate electrode 153 may be located on the same layer as the first gate electrode G1 of the first transistor T1. For example, a second conductive layer may include the pseudo-gate electrode 153. The pseudo-gate electrode 153 may include a conductive material, such as molybdenum (Mo), aluminum (Al), copper (Cu), titanium (Ti), etc., and may have a multi-layer or single-layer structure including the above-described material.

The pseudo-gate electrode 153 may be electrically connected to the drain region of the second semiconductor layer, that is, the first terminal of the pseudo-diode PED.

The second insulating layer 115 may be located on the first insulating layer 113 to cover the pseudo-gate electrode 153. A third conductive layer may be located on the second insulating layer 115. The third conductive layer may include the data line DL and a second connection electrode CM2 arranged in the first sub-area SA1, and a third connection electrode 161 and a fourth connection electrode 162 arranged in the second sub-area SA2. That is, the data line DL, the second connection electrode CM2, the third connection electrode 161, and the fourth connection electrode 162 may be located on the same layer as one another.

The data line DL may be electrically connected to one terminal of the second transistor T2 (refer to FIG. 5) of the test circuit TPC to transmit the data signal DATA (refer to FIG. 5) to the test pixel TPX.

The second connection electrode CM2 may be electrically connected to the shield layer GSH of the test circuit TPC through a contact hole penetrating the first insulating layer 113 and the second insulating layer 115. The second connection electrode CM2 may be electrically connected to one terminal of the pseudo-diode PED. As described above with reference to FIG. 5, the second connection electrode CM2 may serve as the second node N2 electrically connecting the first transistor T1, the storage capacitor Cst, the holding capacitor Chold, and the pseudo-diode PED to one another.

The third connection electrode 161 may be electrically connected to the control electrode 151 of the pseudo-diode PED through a contact hole penetrating the first insulating layer 113 and the second insulating layer 115. The third connection electrode 161 may be connected to the control voltage line VL2 (refer to FIG. 5) configured to transfer the control voltage VC (refer to FIG. 5) to the control electrode 151.

The fourth connection electrode 162 may be electrically connected to the source region of the second semiconductor layer through a contact hole penetrating the second insulating layer 115. The fourth connection electrode 162 may be connected to the common voltage line VL1 (refer to FIG. 5), which is configured to transfer the second driving voltage ELVSS (refer to FIG. 5) to the second terminal of the pseudo-diode PED. The second driving voltage ELVSS applied to the second terminal of the pseudo-diode PED may have substantially the same magnitude as the second driving voltage ELVSS (refer to FIG. 3) applied to an opposite electrode of the light-emitting diode ED (refer to FIG. 3).

Although FIG. 9 shows the pseudo-diode PED including one transistor, one or more embodiments are not limited thereto. In some embodiments, the pseudo-diode PED may include a plurality of transistors connected in series. For example, the pseudo-diode PED may include two transistors connected in series, and each of the transistors may include a pseudo-gate electrode, a second semiconductor layer, and a control electrode located under the second semiconductor layer.

As shown in FIG. 8, in the pad area PDA, a plurality of pads PAD1 to PAD14 may be apart from one another along one side boundary of the peripheral area PA. The pads PAD1 to PAD14 may be exposed without being covered by an insulating layer, and thus may be electrically connected to the flexible printed circuit board FPC (refer to FIG. 1) and the circuit board 40 (refer to FIG. 1).

Connection lines CL1 to CL14 extending from the pad area PDA to the test pixel area TEA may be arranged in the peripheral area PA. The connection lines CL1 to CL14 may electrically connect the test circuits TPC or the pseudo-diodes PED to the corresponding pads PAD1 to PAD14, respectively.

For example, the first connection line CL1 may electrically connect the first pad PAD1 to the first to fourth pseudo-diodes PED1 to PED4. The first pad PAD1 may receive a control voltage VC (refer to FIG. 5) from a power supply. The first connection line CL1 may be configured to transfer the control voltage VC (refer to FIG. 5) from the first pad PAD1 to the control electrode 151 of each of the first to fourth pseudo-diodes PED1 to PED4. The first connection line CL1 may correspond to the control voltage line VL2 shown in FIG. 5.

The second connection line CL2 may be configured to transmit the third gate signal GI (refer to FIG. 5) from the second pad PAD2 to the fourth transistor T4 (refer to FIG. 5) of each of the test circuits TPC. The third connection line CL3 may be configured to transmit the first gate signal GW (refer to FIG. 5) from the third pad PAD3 to the second transistor T2 (refer to FIG. 5) of each of the test circuits TPC. The fourth connection line CL4 may be configured to transmit the second gate signal GR (refer to FIG. 5) from the fourth pad PAD4 to the third transistor T3 (refer to FIG. 5) of each of the test circuits TPC.

The sixth connection line CL6, the eighth connection line CL8, the tenth connection line CL10, and the twelfth connection line CL12 may extend from the sixth pad PAD6, the eighth pad PAD8, the tenth pad PAD10, and the twelfth pad PAD12, respectively, and may be connected to the corresponding test pixels TPX. For example, the sixth connection line CL6 may be connected to the first pseudo-diode PED1 and the first test circuit electrically connected to the first pseudo-diode PED1, the eighth connection line CL8 may be connected to the second pseudo-diode PED2 and the second test circuit electrically connected to the second pseudo-diode PED2, the tenth connection line CL10 may be connected to the third pseudo-diode PED3 and the third test circuit electrically connected to the third pseudo-diode PED3, and the twelfth connection line CL12 may be connected to the fourth pseudo-diode PED4 and the fourth test circuit electrically connected to the fourth pseudo-diode PED4.

Each of the sixth pad PAD6, the eighth pad PAD8, the tenth pad PAD10, and the twelfth pad PAD12 may be connected to a measurement circuit located on the circuit board 40 (refer to FIG. 1) through the flexible printed circuit board FPC (refer to FIG. 1). The measurement circuit may be configured to measure the test current It (refer to FIG. 5) flowing through the pseudo-diode PED of the test pixel TPX connected to each of the sixth pad PAD6, the eighth pad PAD8, the tenth pad PAD10, and the twelfth pad PAD12.

The fifth connection line CL5, the seventh connection line CL7, the ninth connection line CL9, the eleventh connection line CL11, and the thirteenth connection line CL13 may be ground lines. For example, respective ends of the fifth connection line CL5, the seventh connection line CL7, the ninth connection line CL9, the eleventh connection line CL11, and the thirteenth connection line CL13 may be connected to the fifth pad PAD5, the seventh pad PAD7, the ninth pad PAD9, the eleventh pad PAD11, and the thirteenth pad PAD13, and the other respective ends may not be electrically connected to any other element. The fifth pad PAD5, the seventh pad PAD7, the ninth pad PAD9, the eleventh pad PAD11, and the thirteenth pad PAD13 may be grounded.

The fifth connection line CL5 and the seventh connection line CL7 may be adjacent to each other with the sixth connection line CL6 therebetween. The seventh connection line CL7 and the ninth connection line CL9 may be adjacent to each other with the eighth connection line CL8 therebetween. The ninth connection line CL9 and the eleventh connection line CL11 may be adjacent to each other with the tenth connection line CL10 therebetween. The eleventh connection line CL11 and the thirteenth connection line CL13 may be adjacent to each other with the twelfth connection line CL12 therebetween. In other words, the fifth connection line CL5, the seventh connection line CL7, the ninth connection line CL9, the eleventh connection line CL11, and the thirteenth connection line CL13, which are grounded, may at least partially surround the sixth connection line CL6, the eighth connection line CL8, the tenth connection line CL10, and the twelfth connection line CL12, which are wires for signal measurement.

The fifth connection line CL5, the seventh connection line CL7, the ninth connection line CL9, the eleventh connection line CL11, and the thirteenth connection line CL13 may prevent or reduce interference caused by wires adjacent to the sixth connection line CL6, the eighth connection line CL8, the tenth connection line CL10, and the twelfth connection line CL12.

The fourteenth connection line CL14 may electrically connect the fourteenth pad PAD14 to the first to fourth pseudo-diodes PED1 to PED4. The fourteenth connection line CL14 may be configured to transfer the second driving voltage ELVSS from the fourteenth pad PAD14 to a second terminal of each of the first to fourth pseudo-diodes PED1 to PED4. The fourteenth connection line CL14 may correspond to the common voltage line VL1 shown in FIG. 5.

The number and arrangement of test circuits TPC, pseudo-diodes PED, pads PAD1 to PAD14, and connection lines CL1 to CL14 may be variously designed and changed.

FIGS. 10A to 10E are graphs showing results of measuring a V-I curve of a pseudo-diode according to a control voltage applied to a control electrode of the pseudo-diode.

As described above with reference to FIG. 6, a reverse current having a negative value due to a difference between the initialization voltage VINT and the second driving voltage ELVSS may flow during the first initialization period P1 and the second initialization period P4 when the third gate signal GI is applied. Accordingly, a value of the test current It was measured during the emission period EP. The first pseudo-diode PED1 corresponds to a light-emitting diode emitting red light, the second pseudo-diode PED2 corresponds to a light-emitting diode emitting green light, and the third pseudo-diode PED3 corresponds to a light-emitting diode emitting blue light.

Figure 10A:
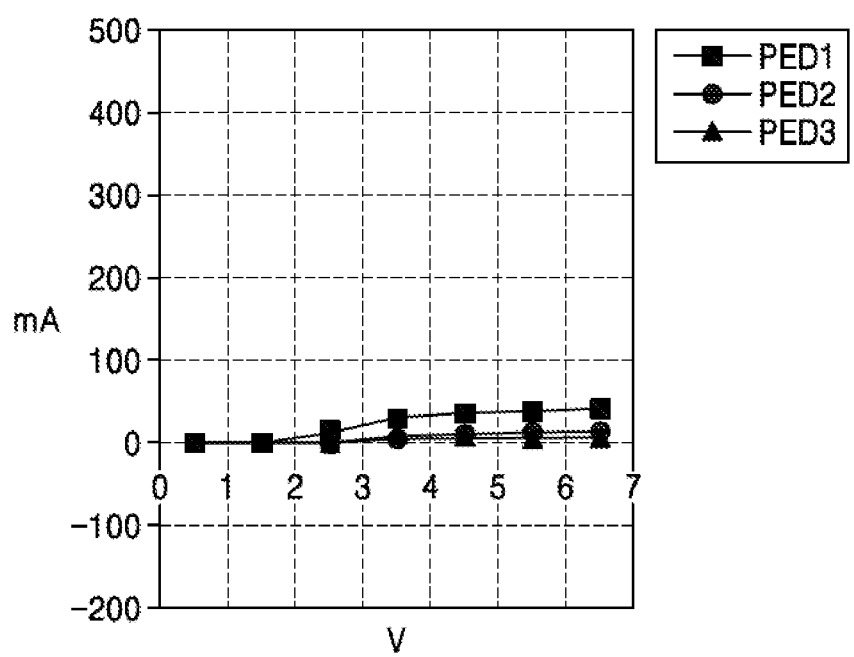
FIGS. 10A to 10E are graphs showing results of measuring a V-I curve of a pseudo-diode according to a control voltage applied to a control electrode of the pseudo-diode.
Figure 10B:
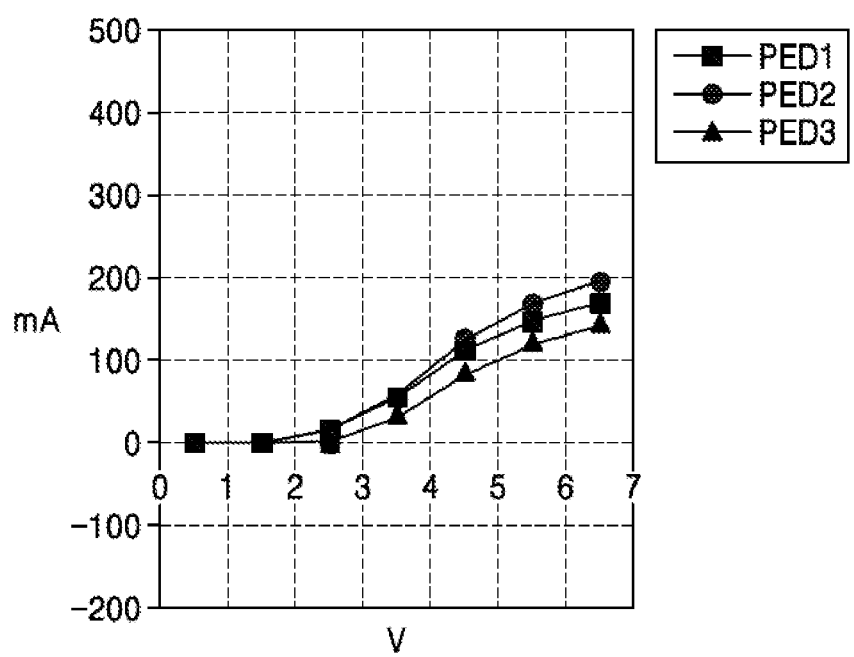
Figure 10C:
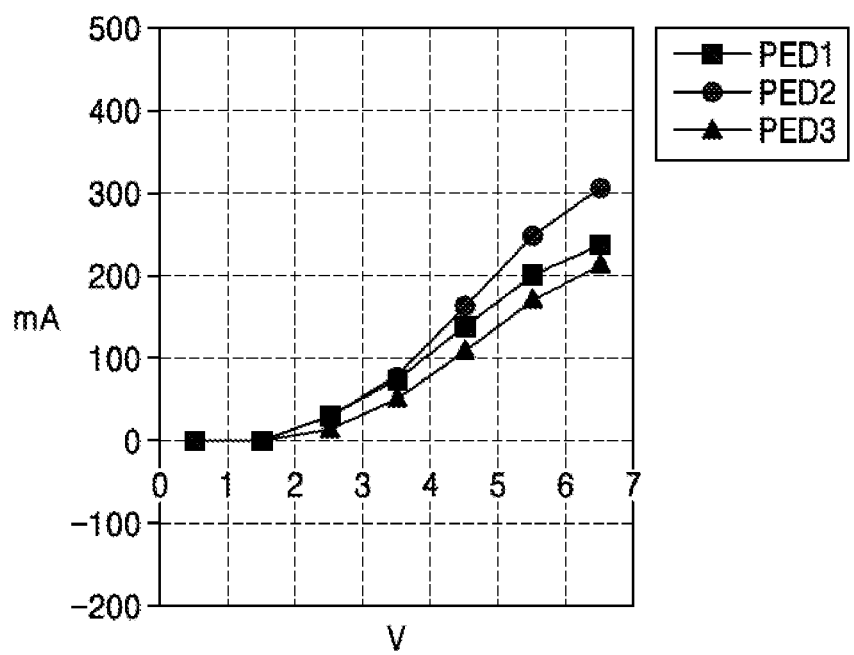
Figure 10D:
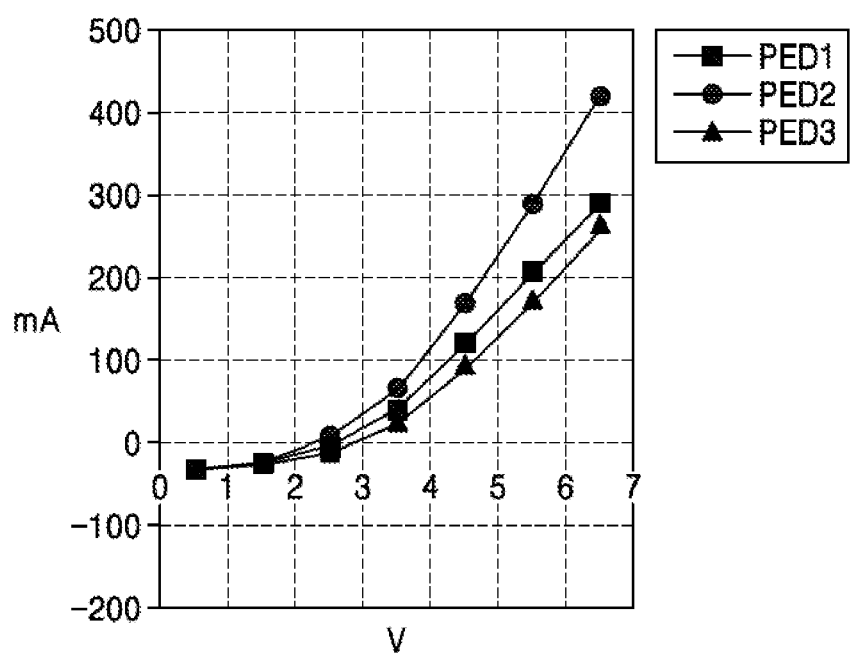
Figure 10E:
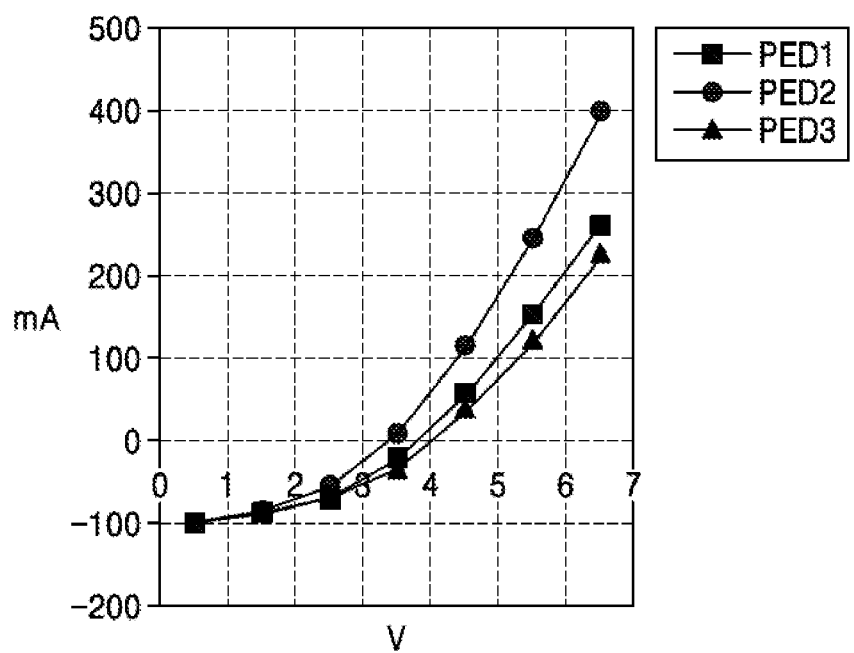

In FIG. 10A, the control voltage VC (refer to FIG. 5) is about −4 V. In FIG. 10B, the control voltage VC is about −2 V. In FIG. 10C, the control voltage VC is about −1.2 V. In FIG. 10D, the control voltage VC is about 0 V. In FIG. 10E, the control voltage VC is about 1 V.

It may be confirmed that a V-I curve of a test pixel changes as a value of a control voltage applied to a control electrode of a pseudo-diode varies. As shown in FIG. 10A, if the control voltage VC is about −4 V or less, a value of current may excessively decrease. As shown in FIGS. 10D and 10E, if the control voltage VC is about 0 V or greater, a reverse current may flow if a low gate voltage is applied to a pseudo-gate electrode. As shown in FIGS. 10B and 10C, if the control voltage VC has a value of about −2.5 V to about −1 V, a V-I curve similar to that of a light-emitting diode arranged in a display area is shown.

Accordingly, the magnitude of a control voltage applied to a control electrode of a pseudo-diode may be adjusted such that a V-I curve of a light-emitting diode arranged in a display area and a V-I curve of a pseudo-diode have similar shapes to each other. For example, a control voltage applied to a control electrode of a pseudo-diode may have a value of about −2.5 V to about −1 V to have electrical characteristics that are similar to those of a light-emitting diode arranged in a display area. The control voltage applied to a control electrode of a pseudo-diode may be about −2.2 V.

According to one or more of the above embodiments, a display panel in which degradation curves of transistors may be easily measured may be implemented. However, one or more embodiments are not limited by such an effect.

It should be understood that embodiments described herein should be considered in a descriptive sense only and not for purposes of limitation. Descriptions of aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, with functional equivalents thereof to be included therein.

What is claimed is:

1. A display panel comprising:
a substrate comprising a display area, and a peripheral area surrounding the display area in plan view;
a pixel circuit in the display area;
a light-emitting diode in the display area, electrically connected to the pixel circuit, and comprising a pixel electrode, an opposite electrode, and an emission layer between the pixel electrode and the opposite electrode;
a test circuit in the peripheral area; and
a pseudo-diode in the peripheral area, electrically connected to the test circuit, comprising a first transistor, and configured such that one or more electrical characteristics of the pseudo-diode are able to be adjusted to more closely match one or more electrical characteristics of the light-emitting diode.

2. The display panel of claim 1, wherein the first transistor comprises a semiconductor layer, a gate electrode above the semiconductor layer, and a control electrode below the semiconductor layer.

3. The display panel of claim 2, wherein the semiconductor layer comprises an active region overlapping the gate electrode, and a drain region and a source region on respective sides of the active region, and
wherein the gate electrode is electrically connected to the drain region.

4. The display panel of claim 1, wherein the pseudo-diode further comprises a second transistor connected to the first transistor in series.

5. The display panel of claim 1, further comprising:
pads in the peripheral area; and
connection lines electrically connecting the pads to the test circuit and to the pseudo-diode.

6. The display panel of claim 5, wherein the test circuit and the pseudo-diode are adjacent to the pads.

7. The display panel of claim 5, wherein the connection lines comprise a first connection line electrically connecting a first pad of the pads to a control electrode of the first transistor, and
wherein the first pad and the first connection line are configured to transfer a control voltage from a power supply to the control electrode.

8. The display panel of claim 7, wherein the control voltage is configured to be adjusted such that a V-I curve of the pseudo-diode and a V-I curve of the light-emitting diode have similar shapes to each other.

9. The display panel of claim 5, wherein the connection lines comprise a second connection line electrically connecting a second pad of the pads to the test circuit and to the pseudo-diode, and
wherein the second pad and the second connection line are configured to transfer a test current from the pseudo-diode to a measurement circuit.

10. The display panel of claim 9, wherein the connection lines further comprise a third connection line electrically connected to a third pad of the pads that is grounded, and a fourth connection line electrically connected to a fourth pad of the pads that is grounded, and wherein each of the third connection line and the fourth connection line surrounds at least a portion of the second connection line in the plan view.

11. A display panel comprising a pixel in a display area, and a test pixel in a peripheral area,
wherein the pixel comprises a pixel circuit, and a light-emitting diode electrically connected to the pixel circuit, and
wherein the test pixel comprises:
a test circuit comprising:
   a driving transistor comprising a driving gate electrically connected to a first node, a first terminal, and a second terminal electrically connected to a second node;
   a data writing transistor electrically connected between the first node and a data line;
   a compensation transistor electrically connected between the first node and a first voltage line;
   an initialization transistor electrically connected between the second node and a second voltage line;
   an emission control transistor electrically connected between the first terminal of the driving transistor and a third voltage line;
   a storage capacitor electrically connected between the first node and the second node; and
   a holding capacitor electrically connected between the third voltage line and the second node; and
a pseudo-diode electrically connected to the test circuit, not configured to emit light, electrically connected between the second node and a fourth voltage line, and configured such that one or more electrical characteristics of the pseudo-diode are able to be adjusted to more closely match one or more electrical characteristics of the light-emitting diode.

12. The display panel of claim 11, wherein the pseudo-diode comprises a gate, a first terminal electrically connected to the gate of the pseudo-diode and to the second node, a second terminal electrically connected to the fourth voltage line, and a control electrode electrically connected to a fifth voltage line.

13. The display panel of claim 11, wherein the test pixel operates in a first period and a second period during one frame period, and
wherein the first period comprises:
   a first initialization period during which the compensation transistor and the initialization transistor are turned on, a first voltage is received from the first voltage line through the compensation transistor that is turned on, and a second voltage is received from the second voltage line through the initialization transistor that is turned on; and
   a second initialization period during which the initialization transistor is turned on, and the second voltage is received from the second voltage line through the initialization transistor that is turned on.

14. The display panel of claim 13, wherein, during the second period, the emission control transistor is turned on, and a third voltage is supplied to the first terminal of the driving transistor through the emission control transistor that is turned on.

15. The display panel of claim 13, wherein the test pixel is connected to a measurement circuit through a connection line electrically connecting the test pixel to a pad, and
wherein the measurement circuit is configured to measure a test current flowing through the pseudo-diode during the second period.

16. The display panel of claim 11, wherein the pixel circuit comprises:
   a driving transistor comprising a driving gate electrically connected to a first node, a first terminal, and a second terminal electrically connected to a second node;
   a data writing transistor electrically connected between the first node of the pixel circuit and a data line;
   a compensation transistor electrically connected between the first node of the pixel circuit and a first voltage line;
   an initialization transistor electrically connected between the second node of the pixel circuit and a second voltage line;
   an emission control transistor electrically connected between the first terminal of the driving transistor of the pixel circuit and a third voltage line;
   a storage capacitor electrically connected between the first node of the pixel circuit and the second node of the pixel circuit; and
   a holding capacitor electrically connected between the third voltage line and the second node of the pixel circuit,
wherein the light-emitting diode is electrically connected to the second node of the pixel circuit.

17. The display panel of claim 16, wherein the pixel is configured to operate in a first period and a second period during one frame period, and
wherein, during the second period, the emission control transistor of the pixel circuit is turned on, and a third voltage is supplied to the first terminal of the driving transistor of the pixel circuit through the emission control transistor that is turned on to allow the light-emitting diode to emit light.

18. The display panel of claim 16, wherein the light-emitting diode comprises a pixel electrode, an opposite electrode, and an emission layer between the pixel electrode and the opposite electrode, and
wherein a voltage applied to the opposite electrode of the light-emitting diode and a fourth voltage applied to the fourth voltage line have substantially a same magnitude.

19. The display panel of claim 11, wherein the pixel is provided in plurality comprising a first pixel for emitting light in a first color, and a second pixel for emitting light in a second color that is different from the first color, and
wherein the test pixel is provided in plurality comprising a first test pixel corresponding to the first pixel, and a second test pixel corresponding to the second pixel.

20. A display panel comprising a pixel in a display area, and a test pixel in a peripheral area,
wherein the pixel comprises a pixel circuit, and a light-emitting diode electrically connected to the pixel circuit, and
wherein the test pixel comprises:
a test circuit comprising:
   a driving transistor comprising a driving gate electrically connected to a first node, a first terminal, and a second terminal electrically connected to a second node;
   a data writing transistor electrically connected between the first node and a data line;
   a compensation transistor electrically connected between the first node and a first voltage line;
   an initialization transistor electrically connected between the second node and a second voltage line;
   an emission control transistor electrically connected between the first terminal of the driving transistor and a third voltage line;

- a storage capacitor electrically connected between the first node and the second node; and
- a holding capacitor electrically connected between the third voltage line and the second node; and
- a pseudo-diode electrically connected to the test circuit, not configured to emit light, and electrically connected between the second node and a fourth voltage line,
- wherein the pseudo-diode comprises a gate, a first terminal electrically connected to the gate of the pseudo-diode and to the second node, a second terminal electrically connected to the fourth voltage line, and a control electrode electrically connected to a fifth voltage line,
- wherein the fifth voltage line is configured to transfer a control voltage from a power supply to the control electrode of the pseudo-diode, and
- wherein the control voltage is configured to be adjusted such that a V-I curve of the pseudo-diode and a V-I curve of the light-emitting diode have similar shapes.

* * * * *